United States Patent
Ando et al.

(10) Patent No.: US 8,921,894 B2
(45) Date of Patent: Dec. 30, 2014

(54) FIELD EFFECT TRANSISTOR, METHOD FOR PRODUCING THE SAME, AND ELECTRONIC DEVICE

(75) Inventors: Yuji Ando, Tokyo (JP); Takashi Inoue, Tokyo (JP); Kazuki Ota, Tokyo (JP); Yasuhiro Okamoto, Tokyo (JP); Tatsuo Nakayama, Tokyo (JP); Kazuomi Endo, Tokyo (JP)

(73) Assignee: NEC Corporation, Tokyo (JP)

( * ) Notice: Subject to any disclaimer, the term of this patent is extended or adjusted under 35 U.S.C. 154(b) by 163 days.

(21) Appl. No.: 13/637,555

(22) PCT Filed: Dec. 15, 2010

(86) PCT No.: PCT/JP2010/072590
§ 371 (c)(1),
(2), (4) Date: Jan. 9, 2013

(87) PCT Pub. No.: WO2011/118098
PCT Pub. Date: Sep. 29, 2011

(65) Prior Publication Data
US 2013/0105811 A1    May 2, 2013

(30) Foreign Application Priority Data
Mar. 26, 2010   (JP) ................. 2010-073879

(51) Int. Cl.
| | | |
|---|---|---|
| H01L 29/778 | (2006.01) | |
| H01L 21/8252 | (2006.01) | |
| H01L 29/78 | (2006.01) | |
| H01L 29/20 | (2006.01) | |
| H01L 29/423 | (2006.01) | |
| H01L 29/66 | (2006.01) | |

(52) U.S. Cl.
CPC ............ *H01L 29/78* (2013.01); *H01L 29/7787* (2013.01); *H01L 21/8252* (2013.01); *H01L 29/7785* (2013.01); *H01L 29/2003* (2013.01); *H01L 29/4232* (2013.01); *H01L 29/66477* (2013.01)
USPC ................................... 257/194; 257/E29.253

(58) Field of Classification Search
USPC ................................... 257/191, 195, E29.249
See application file for complete search history.

(56) References Cited

U.S. PATENT DOCUMENTS

| | | | |
|---|---|---|---|
| 6,515,316 B1 * | 2/2003 | Wojtowicz et al. | ........... 257/194 |
| 7,030,428 B2 * | 4/2006 | Saxler | ........... 257/194 |

(Continued)

FOREIGN PATENT DOCUMENTS

| | | |
|---|---|---|
| JP | 2002-064201 A | 2/2002 |
| JP | 2004-335960 A | 11/2004 |

(Continued)

*Primary Examiner* — Chandra Chaudhari
(74) *Attorney, Agent, or Firm* — Sughrue Mion, PLLC

(57) ABSTRACT

The present invention provides a field effect transistor which can achieve both of a high threshold voltage and a low on-state resistance, a method for producing the same, and an electronic device. In the field effect transistor, each of a buffer layer 112, a channel layer 113, a barrier layer 114, and a spacer layer 115 is formed of a group-III nitride semiconductor, and each of the upper surfaces thereof is a group-III atomic plane that is perpendicular to a (0001) crystal axis. The lattice-relaxed buffer layer 112, the channel layer 113 having a compressive strain, and the barrier layer 114 having a tensile strain, and the spacer layer 115 having a compressive strain are laminated on a substrate 100 in this order. The gate insulating film 14 is arranged on the spacer layer 115. The gate electrode 15 is arranged on the gate insulating film 14. The source electrode 161 and the drain electrode 162 are electrically connected to the channel layer 113 directly or via another component.

22 Claims, 20 Drawing Sheets

(56) References Cited

U.S. PATENT DOCUMENTS

| | | |
|---|---|---|
| 2005/0274980 A1 | 12/2005 | Miyoshi |
| 2007/0045670 A1 | 3/2007 | Kuraguchi |
| 2007/0272945 A1 | 11/2007 | Matsuo et al. |

FOREIGN PATENT DOCUMENTS

| | | |
|---|---|---|
| JP | 2005-512327 A | 4/2005 |
| JP | 2005-277358 A | 10/2005 |
| JP | 2006-032749 A | 2/2006 |
| JP | 2006-032911 A | 2/2006 |
| JP | 2006-222160 A | 8/2006 |
| JP | 2007-067240 A | 3/2007 |
| JP | 2007-165719 A | 6/2007 |
| JP | 2007-311733 A | 11/2007 |
| JP | 2009-021458 A | 1/2009 |
| JP | 2009-054623 A | 3/2009 |
| JP | 2009-099678 A | 5/2009 |
| JP | 2009-231396 A | 10/2009 |
| JP | 2010-010489 A | 1/2010 |
| WO | 03/071607 A1 | 8/2003 |
| WO | 2009/081584 A1 | 7/2009 |
| WO | 2009/113612 A1 | 9/2009 |

* cited by examiner

FIELD EFFECT TRANSISTOR, METHOD FOR PRODUCING THE SAME, AND ELECTRONIC DEVICE

CROSS REFERENCE TO RELATED APPLICATIONS

This application is a National Stage of International Application No. PCT/JP2010/072590 filed Dec. 15, 2010, claiming priority based on Japanese Patent Application No. 2010-073879 filed Mar. 26, 2010, the contents of all of which are incorporated herein by reference in their entirety.

TECHNICAL FIELD

The present invention relates to a field effect transistor, a method for producing the same, and an electronic device.

BACKGROUND ART

Field effect transistors (FETs) are widely used in various electronic devices. Examples of field effect transistors include field effect transistors disclosed in Patent Documents 1 to 3.

A field effect transistor (FET) disclosed in Patent Document 1 includes: a channel portion made of a first GaN-based semiconductor material; and first and second electron supply portions each made of a second GaN-based semiconductor material with a band gap greater than the first GaN-based semiconductor material, joined to the channel portion, and located separately from each other. The channel portion is formed so as to electrically connect to source and drain electrodes. An insulating film is formed on the surface of the channel portion, and a gate electrode is formed on the insulating film. According to the disclosure of Patent Document 1, this FET is of a normally-off type, has an extremely small on-state resistance during an operation, and can achieve a large-current operation.

Patent Document 2 discloses a metal-insulating film-semiconductor (MIS) type FET including: a GaN buffer layer; an AlGaN electron supply layer; and a GaN stress relaxation layer, being laminated in this order. This structure is to suppress generation of carriers caused by a polarization effect by neutralizing polarization charges through making the buffer layer and the stress relaxation layer of the same material of GaN and to enable the FET to achieve a normally-off operation.

Patent Document 3 reports a recess gate-type FET including: a GaN carrier travel layer; an AlGaN barrier layer; and a GaN threshold value control layer, being laminated in this order. This structure also is to suppress generation of carriers caused by a polarization effect by neutralizing polarization charges through making the carrier travel layer and the threshold value control layer of the same material of GaN and to enable the FET to achieve a normally-off operation. According to Patent Document 3, the polarization charges are compensated by the structure, so that an electric field is not generated in the direction perpendicular to a substrate of the threshold value control layer in the pinch-off state, and even when the recess depth, i.e., the thickness of the remaining threshold value control layer in the recess portion is changed, it is difficult to change the threshold voltage $V_{th}$.

Patent Document 4 discloses a FET including: a lower barrier layer made of AlGaN; and a channel layer that is laminated on the lower barrier layer, has a band gap less than the lower barrier layer, and is made of an InGaN layer having a compressive strain. Patent Document 5 discloses a FET including: a lattice-relaxed AlGaN lower barrier layer; an InGaN channel layer having a compressive strain, and an AlGaN contact layer, being laminated in this order. These FETs exert superior characteristics of being capable of achieving a normally-off operation and the like.

PRIOR ART DOCUMENTS

Patent Document

Patent Document 1: WO 2003/071607
Patent Document 2: JP 2004-335960 A
Patent Document 3: JP 2007-067240 A
Patent Document 4: WO 2009/081584
Patent Document 5: WO 2009/113612

SUMMARY OF INVENTION

Problem to be Solved by the Invention

In order to increase an electric power and decrease a loss (save energy) in an electronic device (electronic equipment) using a field effect transistor (FET), the field effect transistor (FET) needs to achieve both of a high threshold voltage and a low on-state resistance. However, none of the field effect transistors (FETs) of Patent Documents 1-3 achieves both of a high threshold voltage and a low on-state resistance. Even though a high threshold voltage and a low on-state resistance can be obtained according to the field effect transistors (FETs) of Patent Documents 4-5, they need to further improve performance thereof in order to further increase an electric power and decrease a loss (save energy) in an electronic device (electronic equipment).

Hence, the present invention is intended to provide a field effect transistor which can achieve both of a high threshold voltage and a low on-state resistance, a method for producing the same, and an electronic device.

Means for Solving Problem

In order to achieve the aforementioned object, the first field effect transistor of the present invention is a field effect transistor including: a substrate; a buffer layer; a channel layer; a barrier layer; a spacer layer; a gate insulating film; a gate electrode; a source electrode; and a drain electrode, wherein the buffer layer is formed of lattice-relaxed $Al_xGa_{1-x}N$ ($0<x<1$), the channel layer is formed of $Al_yGa_{1-y}N$ ($0\leq y<x$) with an Al composition ratio less than the buffer layer, the barrier layer is formed of $Al_zGa_{1-z}N$ ($x<z\leq1$) with an Al composition ratio greater than the buffer layer, the spacer layer is formed of $Al_uGa_{1-u}N$ ($0\leq u<x$) with an Al composition ratio less than the buffer layer, each of the upper surfaces of the buffer layer, the channel layer, the barrier layer, and the spacer layer is a Ga plane or an Al plane that is perpendicular to a (0001) crystal axis, the buffer layer, the channel layer, the barrier layer, and the space layer are laminated on the substrate in this order, the gate insulating film is arranged on the spacer layer, the gate electrode is arranged on the gate insulating film, and the source electrode and the drain electrode are electrically connected to the channel layer directly or via another component.

The second field effect transistor of the present invention is a field effect transistor including: a substrate; a buffer layer; a channel layer; a barrier layer; a spacer layer; a gate electrode; a gate insulating film; a source electrode; and a drain electrode, wherein each of the buffer layer, the channel layer, the barrier layer, and the spacer layer is formed of a group-III nitride semiconductor, each of the upper surfaces of the buffer layer, the channel layer, the barrier layer, and the spacer layer is a group-III atomic plane that is perpendicular to a (0001) crystal axis, the buffer layer is lattice-relaxed, the channel layer has a compressive strain, the barrier layer has a tensile strain, the spacer layer has a compressive strain, the buffer layer, the channel layer, the barrier layer, and the spacer layer are laminated on the substrate in this order, the gate insulating film is arranged on the spacer layer, the gate electrode is arranged on the gate insulating film, and the source electrode and the drain electrode are electrically connected to the channel layer directly or via another component.

The method for producing a first field effect transistor of the present invention is a method for producing a field effect transistor, the method including the steps of: laminating semiconductor layers including a buffer layer, a channel layer, a barrier layer, and a spacer layer on a substrate in this order; forming a gate insulating film on the spacer layer; forming a gate electrode on the gate insulating film; and forming a source electrode and a drain electrode so as to electrically connect to the channel layer directly or via another component, wherein in the step of laminating semiconductor layers, each of the buffer layer, the channel layer, the barrier layer, and the spacer layer is grown on a Ga plane or an Al plane that is perpendicular to a (0001) crystal axis, the buffer layer is formed of lattice-relaxed $Al_xGa_{1-x}N$ ($0<x<1$), the channel layer is formed of $Al_yGa_{1-y}N$ ($0 \leq y<x$) with an Al composition ratio less than the buffer layer, the barrier layer is formed of $Al_zGa_{1-z}N$ ($x<z \leq 1$) with an Al composition ratio greater than the buffer layer, and the spacer layer is formed of $Al_uGa_{1-u}N$ ($0 \leq u<x$) with an Al composition ratio less than the buffer layer.

The method for producing a second field effect transistor of the present invention is a method for producing a field effect transistor, the method including the steps of: laminating semiconductor layers including a buffer layer, a channel layer, a barrier layer, and a spacer layer on a substrate in this order; forming a gate insulating film on the spacer layer; forming a gate electrode on the gate insulating film; and forming a source electrode and a drain electrode so as to electrically connect to the channel layer directly or via another component, wherein in the step of laminating semiconductor layers, each of the buffer layer, the channel layer, the barrier layer, and the spacer layer is grown on a group-III atomic plane that is perpendicular to a (0001) crystal axis, the buffer layer is formed so as to be lattice-relaxed, the channel layer is formed so as to have a compressive strain, the barrier layer is formed so as to have a tensile strain, and the spacer layer is formed so as to have a compression strain.

The electronic device of the present invention includes the first or second field effect transistor of the present invention.

Effects of the Invention

The present invention can provide a field effect transistor which can achieve both of a high threshold voltage and a low on-state resistance, a method for producing the same, and an electronic device.

DESCRIPTION OF EMBODIMENTS

Figure 1A:
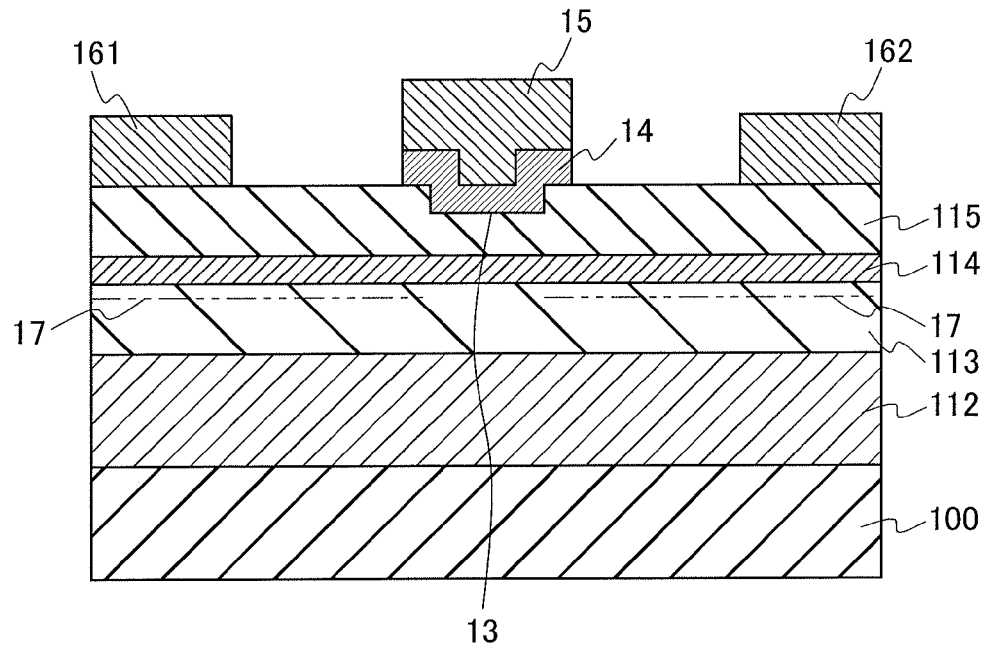
FIG. 1A is a cross-sectional view showing the structure of a FET according to the first embodiment of the present invention.

In the field effect transistor of the present invention, the "on-state resistance" is an electric resistance between a side to which a positive bias is applied and a side to which a negative bias is applied (e.g., between a source electrode and a drain electrode, or between an anode and a cathode) when a voltage is on (a voltage is applied). The "contact resistance" is an electric resistance between an ohmic electrode and a two-dimensional electron gas (2DEG).

In the present invention, unless otherwise indicated, a state of being "on the upper side" is not limited to a state of being directly in contact with the upper surface and includes a state of being indirectly in contact with the upper surface, i.e., being above the upper surface, via any other component. Similarly, unless otherwise indicated, a state of being "on the lower side" may be a state of being directly in contact with the lower surface or a state of being indirectly in contact with the lower surface, i.e., being below the lower surface, via any other component. A state of being "on the upper surface" indicates a state of being directly in contact with the upper surface. Similarly, a state of being "on the lower surface" indicates a state of being directly in contact with the lower surface.

In the present invention, when the n-type impurity (donor impurity) concentration, a p-type impurity concentration, or the like is represented by the volume density ($cm^{-3}$ or the like), it is represented by the volume density with respect to the number of atoms unless otherwise indicated. Similarly, when the effective dose or the like of n-type impurity ions is represented by the area density ($cm^{-2}$ or the like), it is represented by the area density with respect to the number of atoms unless otherwise indicated. The "effective dose" is an actual dose which has reached the upper surface of the electron absorption layer after subtracting a loss caused by being absorbed in the through film and the like.

In the present invention, the concentration of an ionized impurity is the concentration in the state where a voltage is not applied to any of electrodes in a field effect transistor unless otherwise indicated.

In the present invention, the "composition" represents a quantitative relationship among the numbers of atoms of elements composing a semiconductor layer or the like. The "composition ratio" is a relative ratio of the number of atoms of a specific element composing the semiconductor layer or the like to the number of atoms of the other elements. For example, in a semiconductor layer represented by the composition of $Al_xGa_{1-x}N$, the numerical value of x is an "Al composition ratio". In the present invention, when the composition or the composition ratio of a semiconductor layer is defined, an impurity (dopant) which causes conductive properties and the like to be exerted is not considered as an element composing the semiconductor layer. For example, a p-type GaN layer and an n-type GaN layer contain different impurities (dopants) however have the same composition. Moreover, for example, in the case of an n-type GaN layer and an $n^+$GaN layer with an impurity concentration greater than the n-type GaN layer, they have the same composition.

In the present invention, the "main surface" of a substrate, a semiconductor layer, or the like is a surface with the largest area and is, for example, the upper surface or the lower surface, or the front side or the back side.

In the present invention, the "threshold voltage" is a gate voltage at the critical point at which the carrier density in the channel layer becomes positive from 0. The threshold voltage may be represented by a symbol $V_{th}$.

In figures, structures of components described below may be simplified as a matter of convenience of illustration, and dimensional ratios of the respective components may differ from the actual ratios. Moreover, mathematical formulae, graphs, and descriptions thereof are based on theoretical calculations and qualitatively or approximately represents actual phenomena occurred in a FET and the like.

The inventors of the present invention independently examined a threshold voltage and an on-state resistance of a field effect transistor (FET) by theoretical calculations and the like and found the following.

Figure 23:
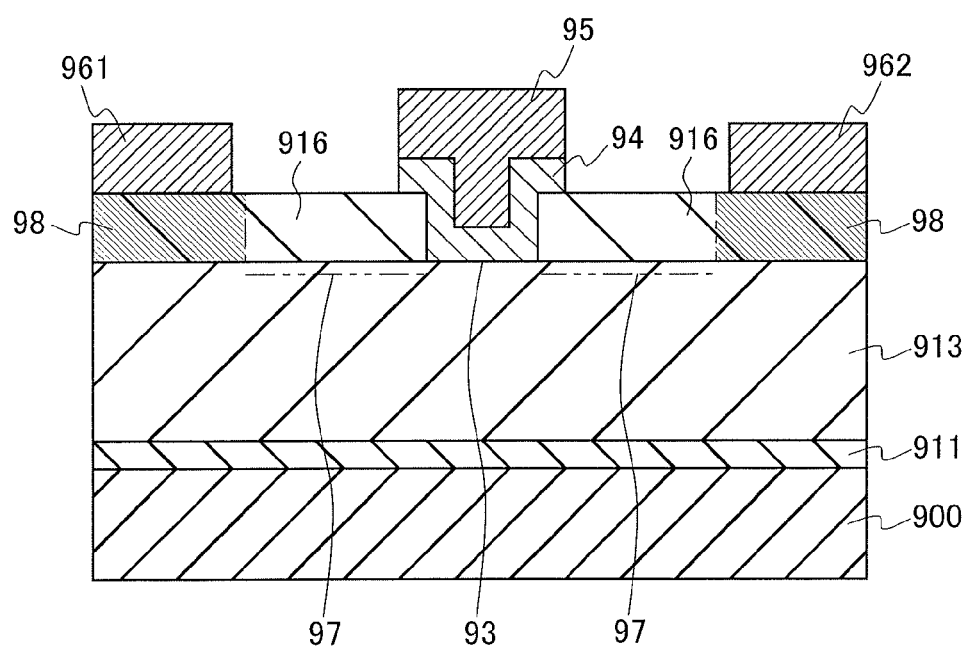
FIG. 23 is a cross-sectional view illustrating the structure of a FET related to the present invention.

The cross-sectional view of FIG. 23 shows an example of the structure of a FET. This structure is similar to that of the FET of Patent Document 1, for example. As shown in FIG. 23, this FET includes a substrate 900, and a nucleation layer 911 formed of undoped aluminum nitride (AlN), a channel layer 913 formed of undoped gallium nitride (GaN), and an electron supply layer 916 formed of undoped aluminum gallium nitride (AlGaN), being laminated on the substrate 900 in this order. A part of the AlGaN electron supply layer 916 is removed by etching until the upper surface of the GaN channel layer 913 is exposed, so that a recess portion (opening portion to be filled) 93 is formed. A gate electrode 95 is formed in the recess portion 93 via the gate insulating film 94 so as to be filled therein. The gate insulating film is in contact with the upper surface of the GaN channel layer 913. A source electrode 961 and a drain electrode 962 are formed on the AlGaN electron supply layer 916 so as to face each other across the gate electrode 95. The respective parts of the AlGaN electron supply layer 916, being in contact with the source electrode 961 and the drain electrode 962 are doped with an n-type impurity at high concentration, so that n-type AlGaN layers 98 are selectively formed. Two dimensional electron gas (2DEG) 97 is generated in the neighborhood of the interface of the channel layer 913 with the electron supply layer 916, and the source electrode 961 and the drain electrode 962 are in ohmic contact with the 2DEG via the respective n-type AlGaN layers 98.

Figure 24:
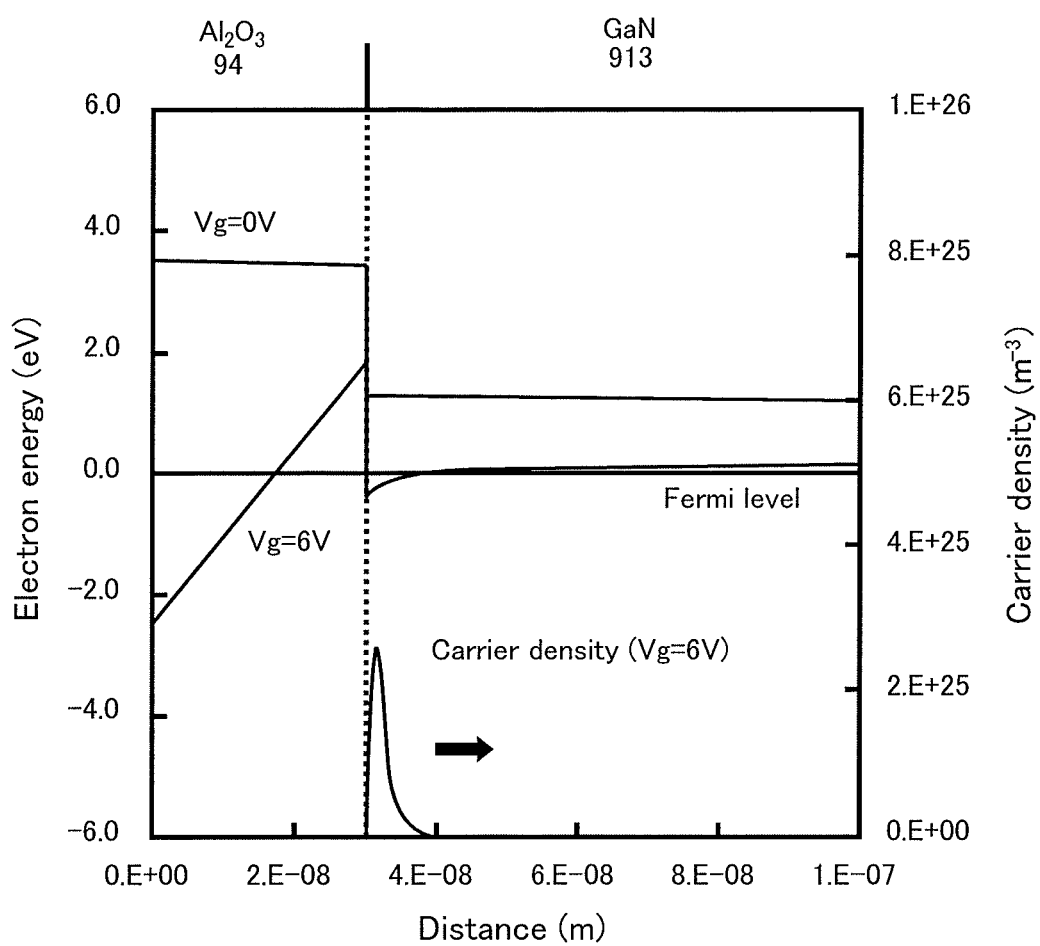
FIG. 24 is a graph illustrating calculation results of the conduction band energy and the carrier density distribution under the gate in the FET of FIG. 23.

The graph of FIG. 24 illustrates calculation results of the conduction band distribution and the carrier density distribution in the direction perpendicular to the main surface of the substrate (direction perpendicular to the substrate) in a part under the gate electrode (under the gate) of the FET having the structure of FIG. 23. As mentioned above, the FET having the structure of FIG. 23 is disclosed in Patent Document 1, for example. In the graph of FIG. 24, the horizontal axis indicates the distance (m) from the lower end of the gate electrode 95 toward the lower side of the FET in the direction perpendicular to the main surface of the substrate 900. The vertical axis indicates the electron energy (eV).

As shown in FIG. 24, in the thermal equilibrium state where the electric potential of the gate electrode 95 is equal to that of the source electrode 961 (state where a gate voltage satisfies $V_g$=0 V), carriers are not present under the gate, and an electric field in the direction perpendicular to the substrate is not generated in the gate insulating film 94. In contrast, when a positive voltage ($V_g=6$ V) is applied to the gate electrode, 2DEG is generated in the neighborhood of the interface of the GaN channel layer 913 with the gate insulating film 94, so that conductive channels 97 are formed. As described above, according to the FET having the structure shown in FIG. 23, a normally-off operation can be performed.

Figure 25:
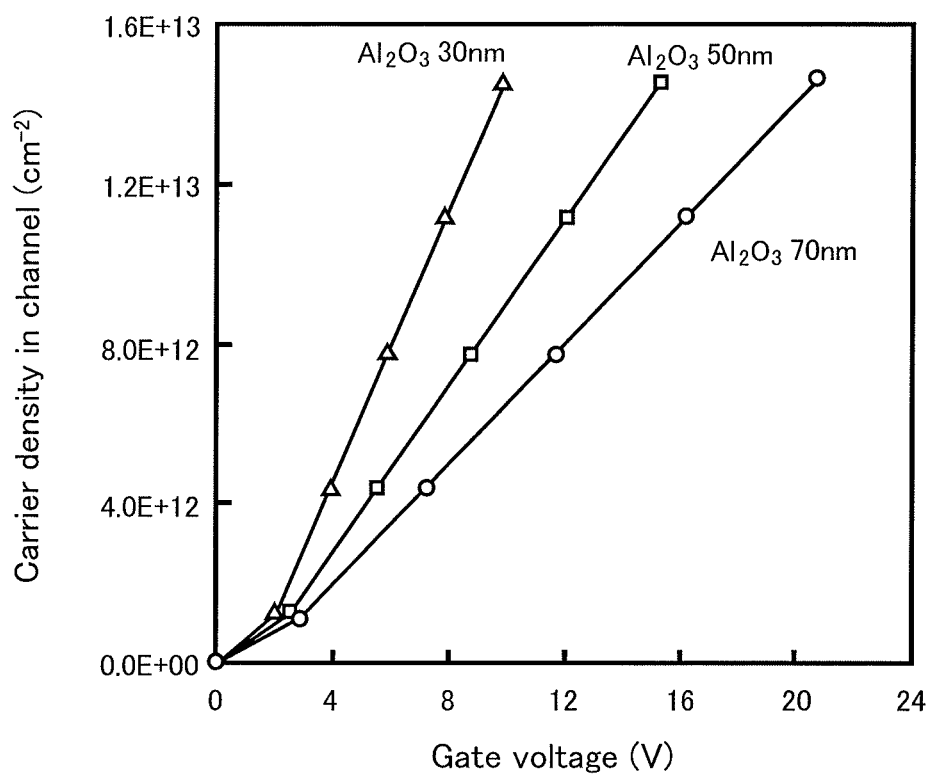
FIG. 25 is a graph illustrating calculation results of the dependency of the carrier density on the thickness of the gate insulating film of the FET of FIG. 23.

Next, the dependency of the gate voltage on the carrier density when the thickness of $Al_2O_3$ as the gate insulating film 94 is changed in the range from 30 to 70 nm in the FET of FIG. 23 is calculated. The calculation results are shown in FIG. 25. In FIG. 25, the horizontal axis indicates the gate voltage (V). The vertical axis indicates the carrier density ($cm^{-2}$) in the channel (conductive channel 97), which is the calculation value at the interface between the GaN channel layer 913 and the gate insulating film 94. As shown in FIG. 25, when the FET having this structure is in the pinch-off state (gate voltage $V_g=0$ V), the strength of an electric field in the direction perpendicular to the substrate, generated in the gate insulating film 94 is small. Therefore, even when the thickness of the gate insulating film 94 is changed, the change in threshold voltage $V_{th}$ is small, and with any thickness, the carrier density is almost 0.

The $V_{th}$ of the FET is determined according to the difference between the Schottky barrier height and the conduction band offset at the interface between the insulating film and the channel layer. Therefore, for example, as shown in FIG. 25, it is difficult to increase the $V_{th}$. In such a FET, the mobility of channel electrons under the gate is from about 100 to 200 $cm^2/Vs$ which is low due to the large roughness of the interface between the gate insulating film 94 and the GaN layer 913, so that the on-state resistance becomes high.

In the FET of Patent Document 2, the mobility of 2DEG generated at the interface between the AlGaN electron supply layer and the GaN buffer layer is from 1000 to 2000 $cm^2/Vs$ which is high, so that it becomes possible to reduce the on-state resistance. However, the polarization charges are compensated. Thus, an electric field in the direction perpendicular to the substrate is not generated in the gate insulating film in the pinch-off state. Therefore, even when the thickness of the gate insulating film is changed, the change in $V_{th}$ is small.

In the FET of Patent Document 3, the mobility of 2DEG generated at the interface between the AlGaN barrier layer and the GaN carrier travel layer is from 1000 to 2000 $cm^2/Vs$ which is high, so that it is possible to reduce the on-state resistance. However, the small change in $V_{th}$ by the change in thickness of an epitaxial layer is equivalent to the small design flexibility of $V_{th}$, so that it is difficult to increase the $V_{th}$.

According to the results of the examinations conducted by the inventors of the present invention, it is difficult to make the threshold voltage $V_{th}$ to be greater than 2 V in any of the FETs of Patent Documents 1-3. Moreover, the FETs of Patent Documents 1-3 cannot achieve both of a high threshold voltage and a low on-state resistance.

A purpose of the present invention is, as mentioned above, to provide a field effect transistor (FET) which can achieve both of a high threshold voltage and a low on-state resistance.

The embodiments of the present invention are described below. It is, however, to be noted that the following embodiments are mere examples, and the present invention is not limited thereby. As described above, actual phenomena occurred in the FET and the like of the present invention may not completely agree with the theoretical descriptions based on the mathematical formulae, graphs, and the like. In the present invention, in the case where the present invention is specified by numerical limitations, it may be strictly specified by the numerical value or may be roughly specified by the numerical value. For example, when the Al composition ratio is "0.4 or more", it may be strictly 0.4 or more or may be about 0.4 or more.

[First Embodiment]

The cross-sectional view of FIG. 1A schematically shows the structure of a FET according to the first embodiment of the present invention. The FET of FIG. 1A is an example of the second field effect transistor of the present invention as well as an example of the first field effect transistor of the present invention. Similarly, each of a variation of the present embodiment and field effect transistors (FETs) of the second to the fourth embodiments described below also is an example of the second field effect transistor of the present invention as well as an example of the first field effect transistor of the present invention.

As shown in FIG. 1A, the FET of FIG. 1A includes: a substrate 100; a buffer layer 112; a channel layer 113; a barrier layer 114; a spacer layer 115; a gate insulating film 14; a gate electrode 15; a source electrode 161; and a drain electrode 162. The buffer layer 112 is formed of lattice-relaxed $Al_xGa_{1-x}N$ (0<x<1). The channel layer 113 is formed of $Al_yGa_{1-y}N$ (0≤y<x) with an Al composition ratio less than the buffer layer 112 and has a compressive strain. The barrier layer 114 is formed of $Al_zGa_{1-z}N$ (x<z≤1) with an Al composition ratio greater than the buffer layer 112 and has a tensile strain. The spacer layer 115 is formed of $Al_uGa_{1-u}N$ (0≤u<x) with an Al composition ratio less than the buffer layer 112 and has a compressive strain. Each of the upper surfaces of the buffer layer 112, the channel layer 113, the barrier layer 114, and the spacer layer 115 is a Ga plane or an Al plane (group-III atomic plane) perpendicular to a (0001) crystal axis.

As shown in FIG. 1A, in this FET, the buffer layer 112, the channel layer 113, the barrier layer 114, and the spacer layer 115 are laminated on the substrate 100 in this order. The gate insulating film 14 is arranged on the spacer layer 115. In FIG. 1A, a recess portion (opening portion to be filled) 13 is formed in the spacer layer 115 and is filled with the gate insulating film 14. The present invention, however, is not limited to this. For example, the gate insulating film may be merely laminated on the spacer layer 115. The gate electrode 15 is arranged on the gate insulating film 14. The source electrode 161 and the drain electrode 162 are in contact with the upper surface of the spacer layer 115 and are arranged so as to face each other across the gate electrode 15. In the FET of the present invention, the arrangement of the source electrode and the drain electrode, however, is not limited thereto as long as they electrically connect to the channel layer directly or via another component.

Figure 1B:
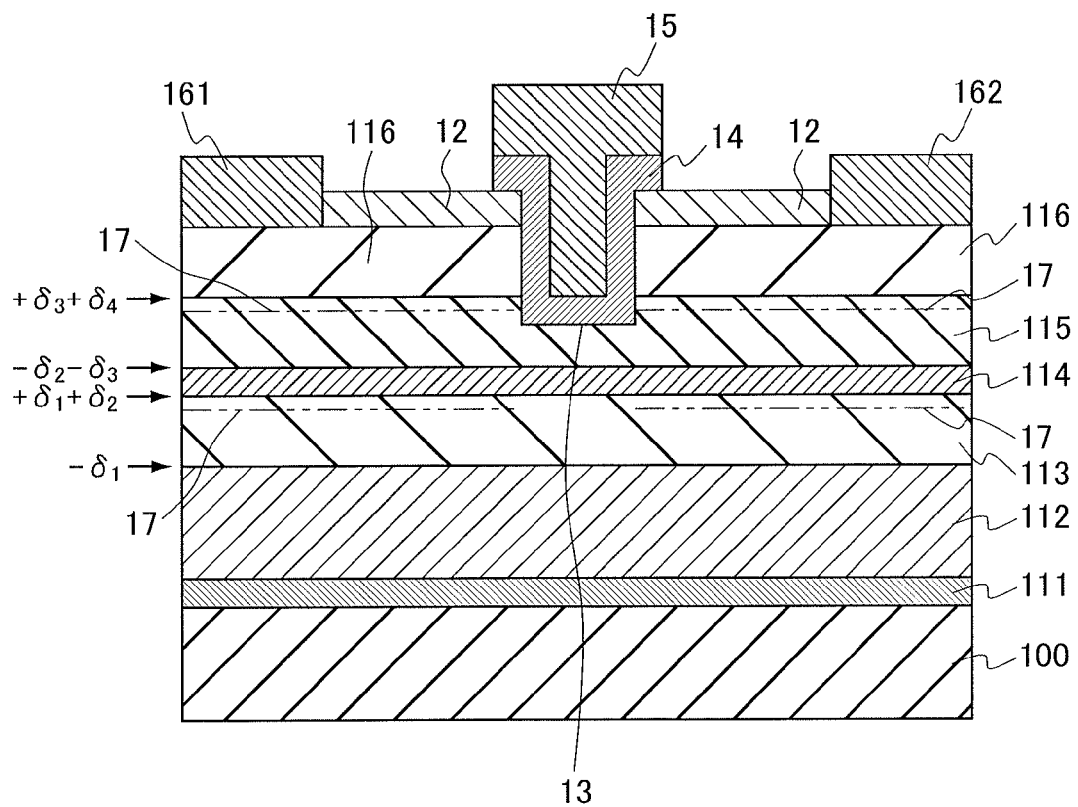
FIG. 1B is a cross-sectional view showing the structure of a variation of the FET according to the first embodiment of the present invention.

The cross-sectional view of FIG. 1B schematically shows the structure of a variation of the FET of the present embodiment. As shown in FIG. 1B, this FET includes, in addition to a substrate 100, a buffer layer 112, a channel layer 113, a barrier layer 114, a spacer layer 115, a gate insulating film 14, a gate electrode 15, a source electrode 161, and a drain electrode 162, a nucleation layer 111, an electron supply layer 116, and a surface protective film 12. The electron supply layer 116 is formed of $Al_vGa_{1-v}N$ (x<v≤1) with an Al composition ratio greater than the buffer layer 112. The nucleation layer 111 is arranged so as to be in contact with the upper surface of the substrate 100, and the buffer layer 112 is arranged so as to be in contact with the upper surface of the nucleation layer 111. The electron supply layer 116 is arranged on the spacer layer 115. An opening portion to be filled (recess portion) 13 is formed from the upper surface of the electron supply layer 116 to the upper surface of the spacer layer 115 in a part of the electron supply layer 116. The recess portion 13 is formed by removing a part of the electron supply layer 116, for example. In FIG. 1B, an upper part of the spacer layer 115 is a little removed, so that the recess portion 13 reaches the inside of the spacer layer 115. The gate electrode 15 and the gate insulating film 14 are arranged so as to fill the opening portion to be filled (recess portion) 13, and the gate insulating film 14 is in contact with the upper surface of the spacer layer 115 (the bottom surface of the recess portion 13). The source electrode 161 and the drain electrode 162 are in contact with the electron supply layer 116 and are arranged so as to face each other across the gate electrode 15. In the FET of FIG. 1B, a part of the upper surface of the electron supply layer 116 other than the parts on which the electrodes are formed (the parts on which the gate electrode 15, the gate insulating film 14, the source electrode 161, and the drain electrode 162 are formed) is covered with a surface protective film 12. The structure of the FET of FIG. 1B other than these is the same as that of the FET of FIG. 1A.

In the FET of the present invention, "lattice-relaxation" represents the state where the lattice constant of a thin film (a semiconductor layer composing the FET) agrees with the lattice constant of its bulk materials. In a semiconductor crystal, the "bulk material" is a semiconductor crystal in the state where the effects of the surface, the interface, and the edge thereof can be ignored. In the state where a lattice constant agree with the lattice constant of a bulk material, the lattice constant does not need to strictly agree with the lattice constant of the bulk material and may agree with it with an error of ±0.1% or less, for example. The error is preferably ±0.03% or less, more preferably ±0.01% or less, and ideally 0. Moreover, in the present invention, the "lattice-relaxed" layer may not be a layer which has been entirely lattice-relaxed, and it is only necessary that a part of the layer has been lattice-relaxed. For example, the buffer layer is, as mentioned above, a lattice-relaxed layer. When the lattice constant of the substrate differs from that of the buffer layer, and there is no layer having a lattice relaxation effect between them, it is necessary that the buffer layer has a function to release strain energy by generating a dislocation and a sufficient thickness to reduce the effect of the dislocation. When the buffer layer has a sufficient thickness and no component is laminated thereon, the lattice constant of the topmost surface (that is the lattice plane located on the top and represents the same as the "upper surface") of the buffer layer agrees with that of its bulk semiconductor with the same composition as the buffer layer. When a thin film semiconductor layer with the same composition as such a buffer layer is epitaxially grown on the buffer layer, generation of new dislocation is suppressed. In contrast, when the lattice constant of the substrate is equal to that of the buffer layer, the effect of the dislocation may be ignored, and it is, however, necessary that the buffer layer has a relatively large thickness in order to suppress the effects of a crystal defect and an interface state at the substrate-buffer layer interface. The appropriate thickness of the buffer layer depends on the difference in lattice constant between the substrate and the buffer layer and the state of the substrate-buffer layer interface and is, however, from 0.1 to 10 μm in general.

A general fact (physical law) on generation of interface charges caused by the polarization effect in an AlGaN heterojunction is described below.

When an $Al_aGa_{1-a}N$ layer (a<x) with an Al composition ratio less than $Al_xGa_{1-x}N$ is grown on an $Al_xGa_{1-x}N$ layer having a lattice-relaxed (0001) plane, a compressive strain is generated in the $Al_aGa_{1-a}N$ layer, so that interface charges are generated by piezopolarization. Moreover, the difference in spontaneous polarization between the layers are added as interface charges, so that negative charges with the surface density ($-\sigma_a$) are generated on the substrate side of the $Al_aGa_{1-a}N$ layer, and positive charges with the surface density ($+\sigma_a$) are generated on the surface side (side opposite to the substrate). The absolute value $\sigma_a$ of the surface density of polarization charges is increased in approximate proportion to the difference (x−a) in composition ratio. That is, the $\sigma_a$ is approximately represented by the following mathematical formula (1). In the following mathematical formula (1), q represents the elementary charge, q=1.60219×10$^{-19}$ C. The same applies to the following formulae unless otherwise indicated.

$$\sigma_a/q[cm^{-2}]=5.3\times10^{13}\times(x-a) \quad (1)$$

Even when another semiconductor layer is inserted between the $Al_xGa_{1-x}N$ layer and the $Al_aGa_{1-a}N$ layer, the same interface charges are generated unless the semiconductor layer has been lattice-relaxed.

On the other hand, when an $Al_bGa_{1-b}N$ layer (x<b) with an Al composition ratio greater than $Al_xGa_{1-x}N$ is grown on an $Al_xGa_{1-x}N$ layer having a lattice-relaxed (0001) plane, a tensile strain is generated in the $Al_bGa_{1-b}N$ layer, so that interface charges are generated by piezopolarization. Moreover, the difference in spontaneous polarization between the layers are added as interface charges, so that positive charges with the surface density ($+\sigma_b$) are generated on the substrate side of the $Al_bGa_{1-b}N$ layer, and negative charges with the surface density ($+\sigma_a$) are generated on the surface side (side opposite to the substrate). The absolute value $\sigma_b$ of the surface density of polarization charges is increased in approximate proportion to the difference (b−x) in composition ratio. That is, the $\sigma_b$ is approximately represented by the following mathematical formula (2).

$$\sigma_b/q[cm^{-2}]=6.4\times10^{13}\times(b-x) \quad (2)$$

Even when another semiconductor layer is inserted between the $Al_xGa_{1-x}N$ layer and the $Al_bGa_{1-b}N$ layer, the same interface charges are generated unless the semiconductor layer has been lattice-relaxed.

Based on these facts, an example of formation of interface charges in the FET of the present invention is described below with reference to FIG. 1B.

That is, when an $Al_yGa_{1-y}N$ layer 113 (y<x) with an Al composition ratio less than an $Al_xGa_{1-x}N$ buffer layer 112 having a lattice-relaxed (0001) plane is grown on the buffer layer, negative charges with the surface density ($-\sigma_1$) are generated on the substrate side of the AlGaN layer 113, and positive charges with the surface density ($+\sigma_1$) are generated on the surface side (side opposite to the substrate) based on the mathematical formula (1). When an $Al_zGa_{1-z}N$ layer 114 (x<z) with an Al composition ratio greater than the buffer layer 112 is grown on this $Al_yGa_{1-y}N$ layer 113, positive charges with the surface density ($+\sigma_2$) are generated on the substrate side of the AlGaN layer 114, and negative charges with the surface density ($-\sigma_2$) are generated on the surface side (side opposite to the substrate) based on the mathematical formula (2). When an $Al_uGa_{1-u}N$ layer 115 (u<x) with an Al composition ratio less than the buffer layer 112 is grown on this $Al_zGa_{1-z}N$ layer 114, negative charges with the surface density ($-\sigma_3$) are generated on the substrate side of the AlGaN layer 115, and positive charges with the surface density ($+\sigma_3$) are generated on the surface side (side opposite to the substrate) based on the mathematical formula (1). Furthermore, when an $Al_vGa_{1-v}N$ layer 116 (x<v) with an Al composition ratio greater than the buffer layer 112 is grown on this $Al_uGa_{1-u}N$ layer 115, positive charges with the surface density ($+\sigma_4$) are generated on the substrate side of the AlGaN layer 116, and negative charges with the surface density ($-\sigma_4$) are generated on the surface side, based on the mathematical formula (2).

As described above, negative charges with the surface density ($-\sigma_1$) are generated at the interface between the AlGaN layer 112 and the AlGaN layer 113. Similarly, positive charges as surface density ($+\sigma_1+\sigma_2$) are generated at the interface between the AlGaN layer 113 and the AlGaN layer 114, negative charges with the surface density ($-\sigma_2-\sigma_3$) are generated at the interface between the AlGaN layer 114 and the AlGaN layer 115, and positive charges as surface density ($+\sigma_3+\sigma_4$) are generated at the interface between the AlGaN layer 115 and the AlGaN layer 116. Although negative charges as surface density ($-\sigma_4$) are generated at the topmost surface of the AlGaN layer 116, they are compensated by the interface state between the surface protective film 12 and the AlGaN layer 116.

The sum of interface charges between source-gate and between gate-drain under the electron supply layer 116 is $(-\sigma_1)+(\sigma_1+\sigma_2)+(-\sigma_2-\sigma_3)+(+\sigma_3+\sigma_4)=+\sigma_4$ which is positive. Therefore, 2DEG 17 is generated in each of the channel layer 113 and the spacer layer 115 each with an Al composition ratio less than the buffer layer 112. In contrast, the sum of interface charges under the gate electrode 15 is $(-\sigma_1)+(\sigma_1+\sigma_2)+(-\sigma_2-\sigma_3)=-\sigma_3$ which is negative. Therefore, the channel is depleted in the thermal equilibrium state ($V_g=0$ V), so that 2DEG is not formed.

Next, a method for producing a FET is described. The method for producing a FET of the present invention is not particularly limited. It is however preferred that the FET of the present invention is produced by the first or second method for producing a FET of the present invention. A method for producing a FET shown in FIG. 1B is described below as an example. As the example, the case where the Al composition ratio of the buffer layer 112 satisfies x=0.1, that of the channel layer 113 satisfies y=0.0, that of the barrier layer 114 satisfies z=1.0, that of the spacer layer 115 satisfies u=0.0, and that of the electron supply layer 116 satisfies v=0.2 is described below.

First, a nucleation layer 111 (200 nm) made of a superlattice obtained by laminating alternately undoped AlN and undoped GaN, a buffer layer 112 (1 μm) made of undoped $Al_{0.1}Ga_{0.9}N$, a channel layer 113 made of undoped GaN, a barrier layer 114 made of undoped AlN, a spacer layer 115 made of undoped GaN, and an electron supply layer 116 made of n-type $Al_{0.2}Ga_{0.8}N$ are grown, in this order, on a silicon (Si) substrate 100 having a (111) plane by, for example, Metalorganic Chemical Vapor Deposition (MOCVD) (a step of laminating semiconductor layers). In this step, the crystal growth is growth on a Ga plane or an Al plane which is perpendicular to a (0001) crystal axis. The thickness of each of the GaN layer 113, the AlN layer 114, the GaN layer 115, and the $Al_{0.2}Ga_{0.8}N$ layer 116 is less than the critical thickness at which a dislocation occurs on the $Al_{0.1}Ga_{0.9}N$ buffer layer. Thus, the occurrence of dislocation is suppressed, and favorable crystal quality can be obtained.

Si is used as an n-type impurity. An n-type electron supply layer is used as the electron supply layer 116. The electron supply layer 116 may be, for example, an undoped electron supply layer or a p-type electron supply layer with an impurity concentration of about $1\times10^{17}$ $cm^{-3}$ or less. Undoped semiconductor layers are used as semiconductor layers 112 to 115. The semiconductor layers 112 to 115 may be, for example, p-type or n-type semiconductor layers each with an impurity concentration of about $1\times10^{17}$ $cm^{-3}$ or less.

Further, metals such as titanium (Ti)/aluminum (Al)/nickel (Ni)/gold (Au) are deposited on the electron supply layer 116, which is then subjected to alloy treatment, for example. Thus, a source electrode 161 and a drain electrode 162 are formed and are in ohmic contact with the channel layer 113 (a step of forming a source electrode and a drain electrode). Then, for example, 50 nm of a surface protective film 12 made of an insulator such as silicon nitride ($Si_3N_4$) is deposited using Plasma-Enhanced Chemical Vapor Deposition (PECVD), for example. An opening portion is formed in a part sandwiched between the source electrode 161 and the drain electrode 162 by etching the surface protective film 12 using reactive gas such as sulfur hexafluoride ($SF_6$). Thereafter, for example, a recess portion 13 is formed by removing parts of the AlGaN electron supply layer 116 and GaN spacer layer 115 under the opening portion by etching using reactive gas such as boron chloride ($BCl_3$), for example. Then, a gate insulating film 14 such as $Al_2O_3$ is deposited so as to be filled in the recess portion 13, using, for example, atomic layer deposition (ALD) (a step of forming a gate insulating film). Furthermore, for example, metals such as Ni/Au are deposited on the gate insulating film 14, and lift-off procedures are performed, so that a gate electrode 15 is formed (a step of forming a gate electrode).

By such a method for producing a FET, a FET having the structure of FIG. 1B can be produced. A FET having the structure of FIG. 1A can also be produced in the same manner as in the method except that the formation of the nucleation layer 111, the electron supply layer 116, and the surface protective film 12 in some steps is omitted.

Figure 2:
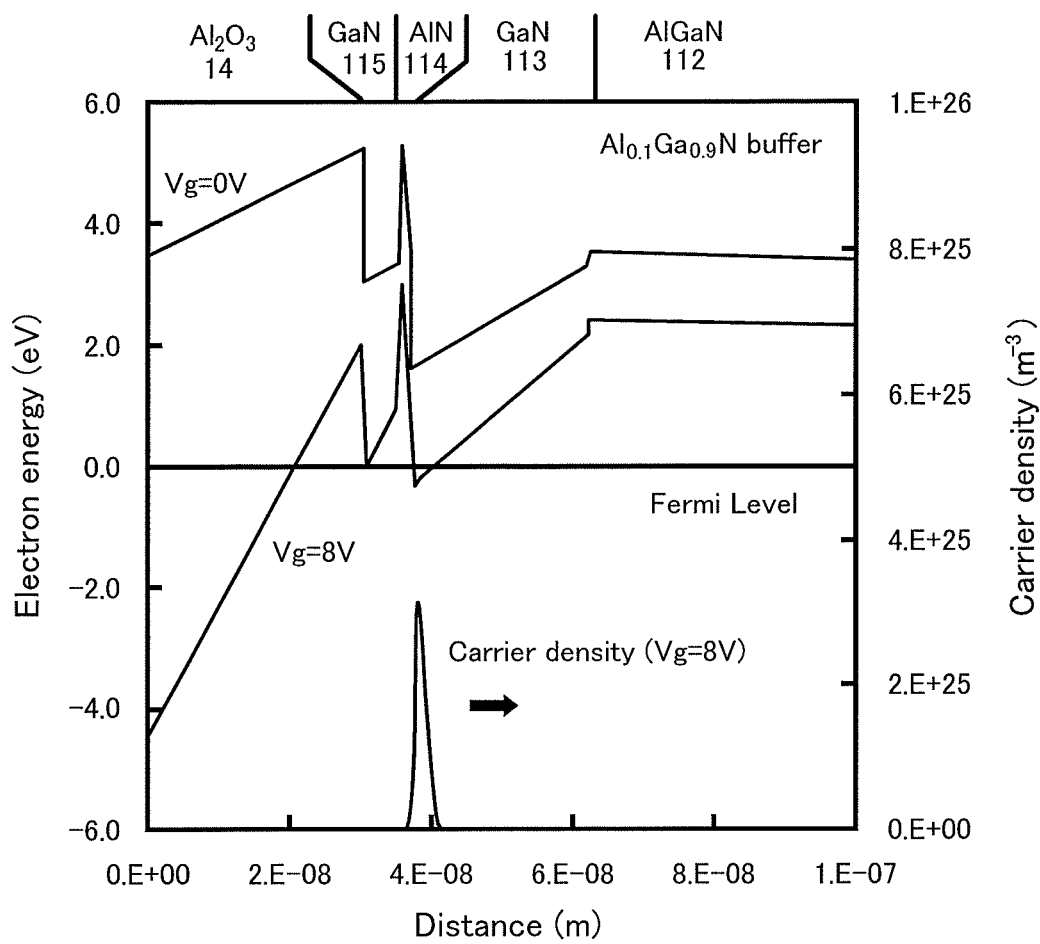
FIG. 2 is a graph illustrating calculation results of the conduction band energy and the carrier density distribution under the gate in the FET according to the first embodiment of the present invention.

FIG. 2 shows an example of calculation results of the conduction band energy distribution and the carrier density distribution in the direction perpendicular to the main surface of the substrate in a part under the gate electrode (under the gate) of a FET having the structure of FIG. 1A or 1B. As the example, FIG. 2 shows results obtained in the case where the Al composition ratio of the buffer layer 112 satisfies x=0.1, that of the channel layer 113 satisfies y=0.0, that of the barrier layer 114 satisfies z=1.0, and that of the spacer layer 115 satisfies u=0.0, and a material for forming a gate insulating film 14 is $Al_2O_3$. In the calculations, the thickness of the buffer layer 112 is 1 μm, that of the channel layer 113 is 25 nm, that of the barrier layer 114 is 2 nm, that of the spacer layer 115 is 5 nm, and that of the gate insulating film 14 is 30 nm. In FIG. 2, the horizontal axis indicates the distance (m) from the lower end of the gate electrode 15 toward the lower side of the FET in the direction perpendicular to the main surface of the substrate 100. The vertical axis indicates the electron energy (eV).

As shown in FIG. 2, carriers are not present under the gate in the thermal equilibrium state ($V_g=0$ V) where the electric potential of the gate electrode is equal to that of the source electrode. In contrast, 2DEG is generated in the GaN channel layer 113 when a positive voltage ($V_g=8$ V) is applied to the gate electrode 15. The band gap of the AlN barrier layer 114 is large, and an electric field directed from the substrate toward the surface of the AlN barrier layer 114 is generated in the AlN barrier layer 114 by a polarization effect. Thus, a potential barrier is formed on the surface side of the GaN channel layer 113. Therefore, 2DEG is hardly formed in the GaN spacer layer 115, and carriers mainly travel in the neighborhood of the interface of the channel layer 113 with the barrier layer 114. The heterointerface between AlN forming the barrier layer 114 and GaN forming the channel layer 113 are flat at the atomic layer level. Therefore, scattering at the interface is suppressed, so that the mobility of channel electrons is from 1000 to 2000 $cm^2$/Vs which is high. Thus, a low on-state resistance can be obtained. In the present embodiment, the sum ($-\sigma_3/q$) of fixed charges present on the substrate side of the gate insulating film 14 is calculated to be $-5.3 \times 10^{12}$ cm$^{-2}$. An electric field directed from the surface of the gate insulating film 14 toward the substrate is generated in the gate insulating film 14 in pinch-off ($V_g$=0 V) due to this negative fixed charges. Therefore, the $V_{th}$ can be increased by increasing the thickness of the gate insulating film 14.

Figure 3:
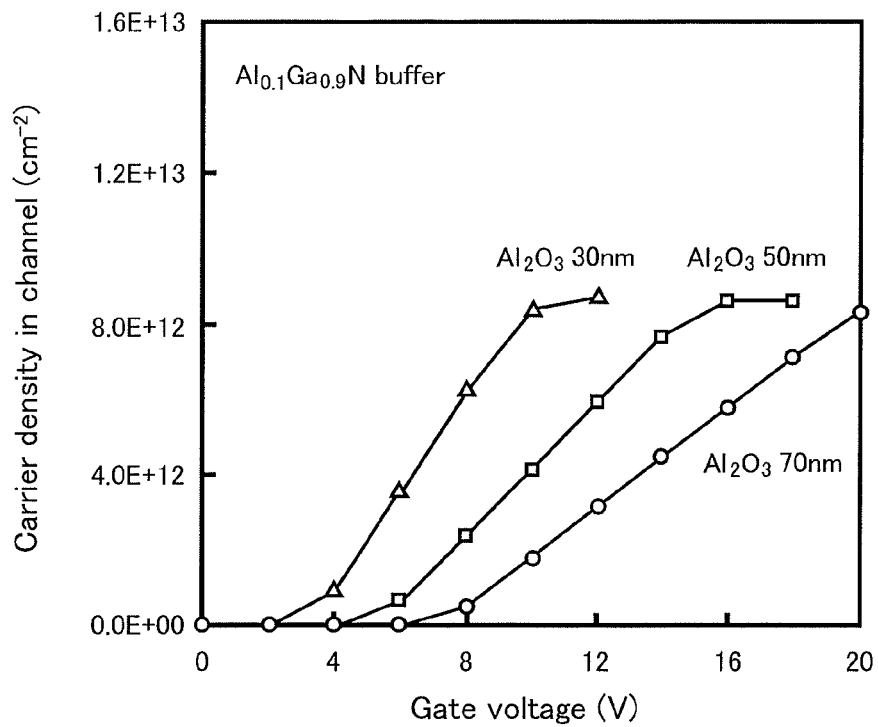
FIG. 3 is a graph illustrating calculation results of the dependency of the carrier density on the thickness of the gate insulating film in the FET according to the first embodiment of the present invention.

FIG. 3 shows an example of calculation results of the dependency of the density of carriers formed in the channel layer 113 of the FET having the structure of FIG. 1A or 1B on the gate voltage. In FIG. 3, the horizontal axis indicates the gate voltage (V). The vertical axis indicates the calculation value of the carrier density (cm$^{-2}$) at the interface of the GaN channel layer 113 with the AlN barrier layer 114. The thickness of the Al$_2$O$_3$ gate insulating film 14 is changed in the range from 30 to 70 nm. The parameters other than the thickness of the Al$_2$O$_3$ gate insulating film 14 are the same as those used in calculations for FIG. 2.

As can be seen from FIG. 3, due to an internal electric field generated in the gate insulating film 14, the $V_{th}$ shifts to the positive side with increasing the thickness of the gate insulating film, and the $V_{th}$ that is +2 V or more can be obtained when the thickness of the gate insulating film is 30 nm or more. However, the intrinsic gate capacitance is reduced with increasing the thickness of the gate insulating film, which results in reduction of the mutual conductance (gm). From the viewpoint of maintaining a forward breakdown voltage and gm, the thickness of the gate insulating film 14 is desirably 5 nm or more to 200 nm or less. The thickness of the gate insulating film is more preferably 30 nm or more to 70 nm or less. With this thickness, it is possible to further adjust the $V_{th}$. In the FET of the present invention, the threshold voltage $V_{th}$ is not particularly limited and is, however, preferably 0 V or more at which a normally off operation can be performed, and preferably 2 V or more. The upper limit of the threshold voltage $V_{th}$ is not particularly limited and is, for example, 20 V or less.

Figure 4:
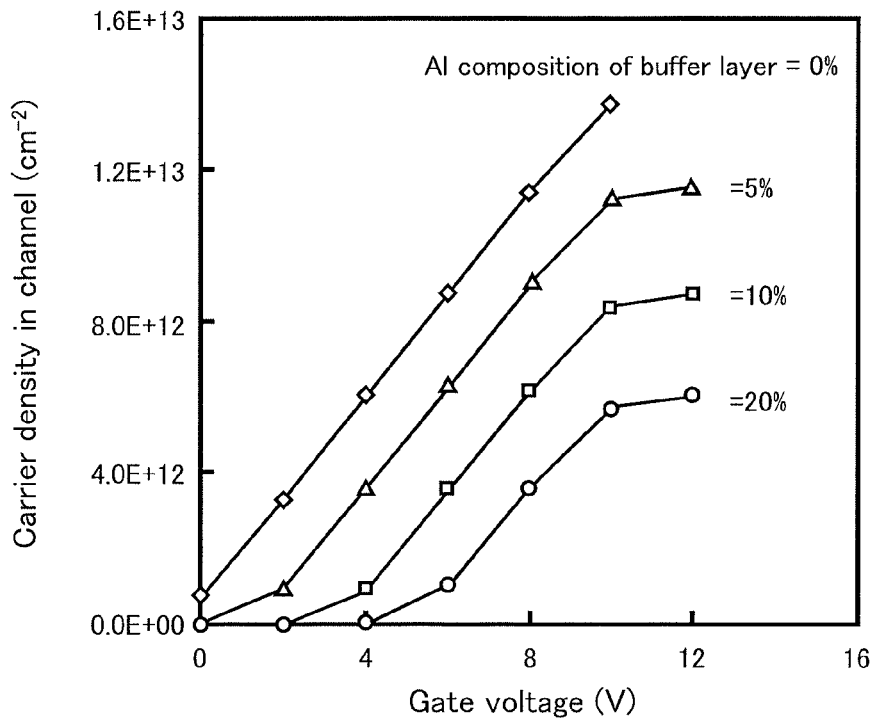
FIG. 4 is a graph illustrating calculation results of the dependency of the carrier density on the Al composition ratio of the buffer layer in the FET according to the first embodiment of the present invention.

FIG. 4 shows an example of calculation results of the dependency of the carrier density in a channel layer on the gate voltage when the Al composition ratio (x) of a buffer layer 112 is changed in the FET having the structure of FIG. 1A or 1B. In FIG. 4, the horizontal axis indicates the gate voltage (V). The vertical axis indicates the calculation value of the carrier density (cm$^{-2}$) at the interface of a GaN channel layer 113 with an AlN barrier layer 114. The parameters other than the Al composition ratio of the buffer layer are the same as those used in calculations for FIG. 2.

As can be seen from FIG. 4, the $V_{th}$ shifts to the positive side with increasing the Al composition ratio x of the buffer layer 112, and it is possible to achieve a normally off operation when the Al composition ratio x is 5% or more. This is because a polarizing effect becomes prominent by increasing the Al composition ratio of the buffer layer, so that negative fixed charges under the gate electrode are increased. That is, the difference (x−u) between the Al composition ratio of the spacer layer 115 (Al composition ratio u, where u=0.0) and that of the buffer layer (Al composition ratio x) becomes large, and the absolute value $\sigma_3$ of polarization charges generated in the spacer layer 115 is increased. The sum of interface charges under the gate electrode 15 is ($-\sigma_3$), so that negative fixed charges are increased, and the $V_{th}$ shifts to the positive side. The maximum carrier density in the channel layer 113 is increased by increasing the Al composition ratio x of the buffer layer, and the carrier density is reduced to about 50% at 20% of the Al composition ratio compared with 0% of the Al composition ratio. The Al composition ratio x of the AlGaN buffer layer 112 in the FET of the present invention is not particularly limited and is, however, preferably 5% (0.05) or more to 20% (0.2) or less from the viewpoint of adjusting the threshold voltage $V_{th}$ and reducing the on-state resistance.

Figure 5:
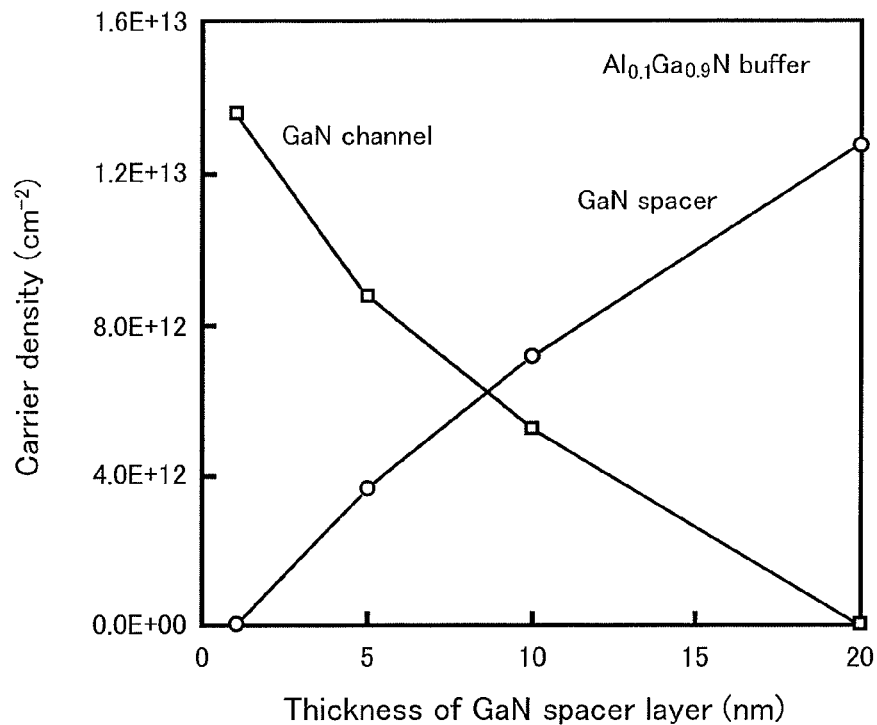
FIG. 5 is a graph illustrating calculation results of the dependency of the carrier density on the thickness of the spacer layer in the FET according to the first embodiment of the present invention.

FIG. 5 shows an example of calculation results of the dependency of each of the densities of carriers stored in the channel layer 113 and the spacer layer 115 on the thickness of the GaN spacer layer 115 in the FET having the structure of FIG. 1A or 1B. In FIG. 5, the horizontal axis indicates the thickness (nm) of the GaN spacer layer which corresponds to the thickness of the remaining spacer layer 115 in the recess portion 13. The vertical axis indicates the calculation value of the carrier density (cm$^{-2}$) at the interface of the GaN channel layer 113 with the AlN barrier layer 114. The parameters other than the thickness of the GaN spacer layer are the same as those used in calculations for FIG. 2.

As can be seen from FIG. 5, the density of carriers stored in the channel layer 113 is increased, and the density of carriers stored in the spacer layer 115 is reduced, with reducing the thickness of the spacer layer 115. From the viewpoint of storing a certain amount of carriers in the channel, the thickness of the spacer layer under the gate electrode (under the gate) is preferably 0.5 nm or more to 20 nm or less. The thickness of the spacer layer under the gate electrode (under the gate) is more preferably 0.5 nm or more to 10 nm or less. For example, In FIG. 5, about 50% or more of the total carriers is stored in the channel when the thickness of the spacer layer 115 is 0.5 nm or more to 10 nm or less, so that the on-state resistance is further reduced.

Figure 6:
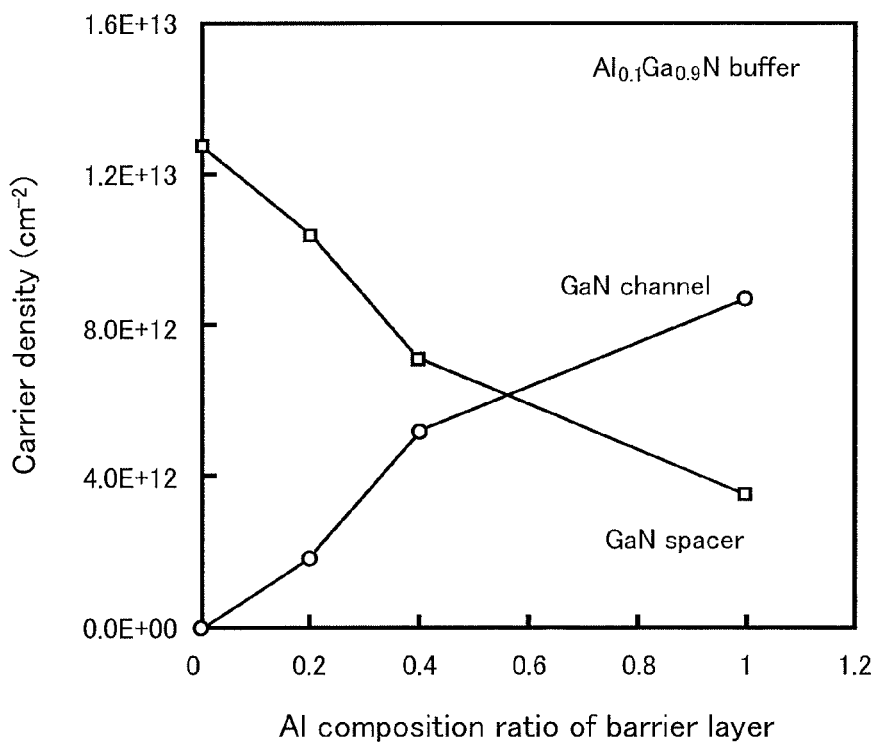
FIG. 6 is a graph illustrating calculation results of the dependency of the carrier density on the Al composition ratio of the barrier layer in the FET according to the first embodiment of the present invention.

FIG. 6 shows an example of calculation results of the dependency of each of the densities of carriers stored in the channel layer 113 and the spacer layer 115 on the Al composition ratio (z) of the AlGaN barrier layer 114 in the FET having the structure of FIG. 1A or 1B. In FIG. 6, the horizontal axis indicates the Al composition ratio of the barrier layer 114. The vertical axis indicates the calculation value of the carrier density (cm$^{-2}$) at the interface of the GaN channel layer 113 with the AlN barrier layer 114. The parameters other than the Al composition ratio of the barrier layer are the same as those used in calculations for FIG. 2.

As can be seen from FIG. 6, the density of carriers stored in the channel layer 113 is increased, and the density of carriers stored in the spacer layer 115 is reduced, with increasing the Al composition ratio z of the barrier layer 114. This is because, with increasing the Al composition ratio of the barrier layer, the offset of the conduction band at the interface with the barrier layer is increased, and the polarization electric field generated in the barrier layer is increased, so that more carriers are trapped in the channel layer. From the viewpoint of trapping more carriers and improving the on-state resistance, the Al composition ratio of the barrier layer is preferably 40% (0.4) or more.

Figure 7:
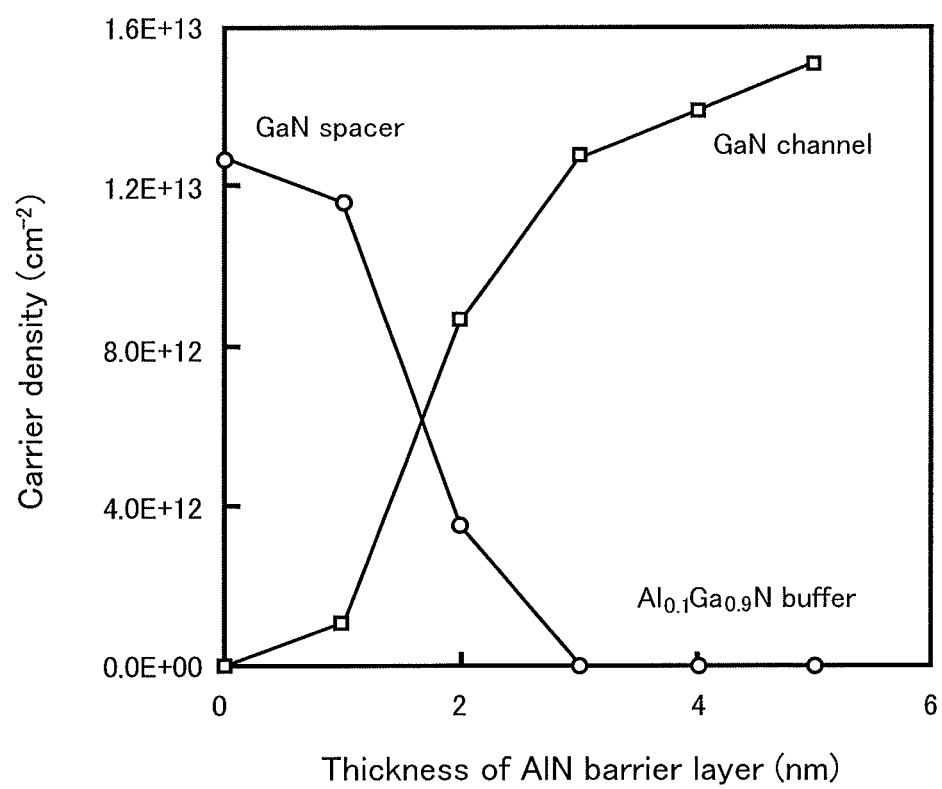
FIG. 7 is a graph illustrating calculation results of the dependency of the carrier density on the thickness of the barrier layer in the FET according to the first embodiment of the present invention.

FIG. 7 shows an example of calculation results of the dependency of each of the densities of carriers stored in the channel layer 114 and the spacer layer 115 on the thickness of the AlN barrier layer 114 in the FET having the structure of FIG. 1A or 1B. In FIG. 7, the horizontal axis indicates the thickness (nm) of the AlN barrier layer 114. The vertical axis indicates the calculation value of the carrier density (cm$^{-2}$) at the interface of the GaN channel layer 113 with the AlN barrier layer 114. The parameters other than the thickness of the barrier layer are the same as those used in calculations for FIG. 2.

As can be seen from FIG. 7, more carriers are trapped in the channel layer, the density of carriers stored in the channel layer is increased, and the density of carriers stored in the spacer layer is reduced, with increasing the thickness of the barrier layer. It is considered that when the thickness of the AlN barrier layer is 10 nm or less, a lattice strain is relatively small, and a dislocation is less prone to occur. From the viewpoint of trapping more carriers and maintaining the crystal quality, the thickness of the AlN barrier layer is preferably 1 nm or more to 10 nm or less.

In the first FET of the present invention, the Al composition ratio y of the channel layer and the Al composition ratio u of the spacer layer are only necessary to satisfy the above-described relational formulae ($0 \leq y < x$, $0 \leq u < x$). However, from the viewpoint of reducing no electron mobility, the Al composition ratio y and the Al composition ratio u preferably are not too high. Specifically, the Al composition ratio y and the Al composition ratio u are preferably 10% (0.1) or less.

Figure 8:
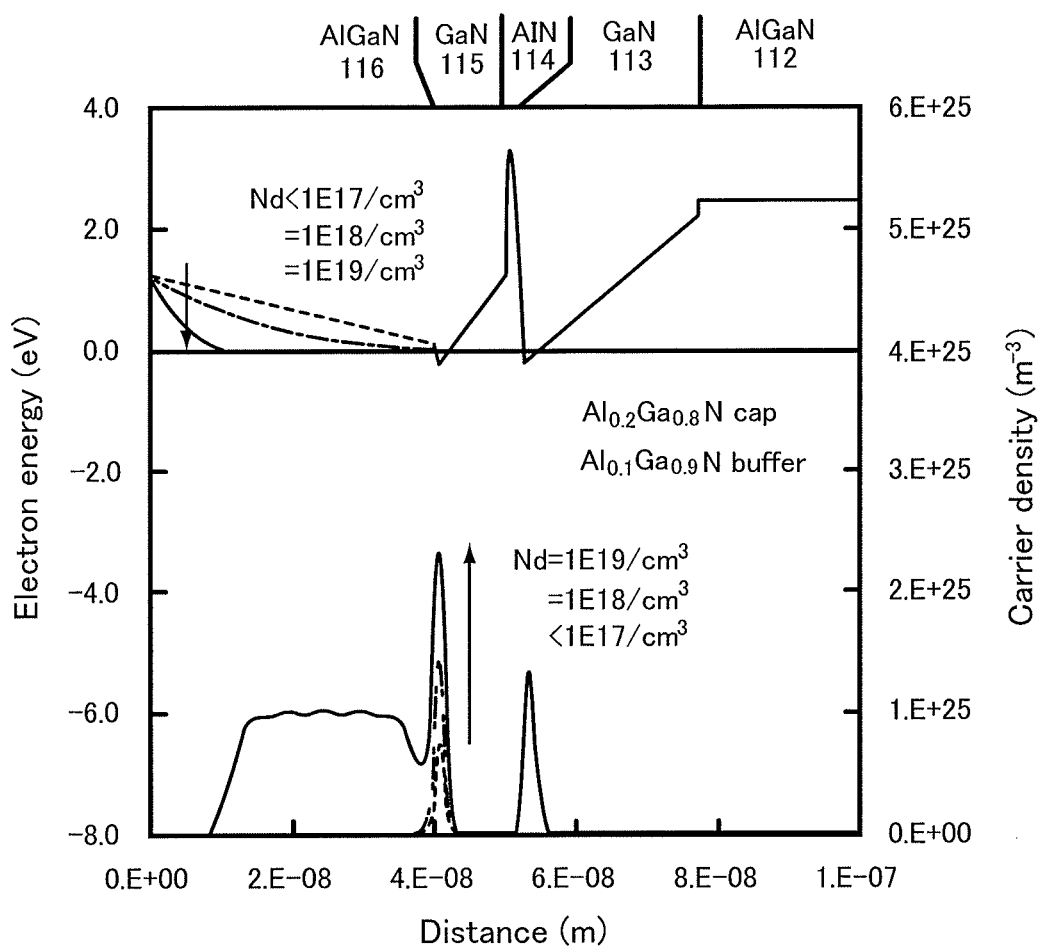
FIG. 8 is a graph illustrating calculation results of the conduction band energy and the carrier density distribution between source-gate and between gate-drain in the FET according to the first embodiment of the present invention.

FIG. 8 shows an example of calculation results of the conduction band energy distribution and the carrier density distribution between source-gate and between gate-drain in the direction perpendicular to the main surface of a substrate in a FET having the structure of FIG. 1A or 1B. In FIG. 8, the horizontal axis indicates the distance (m) from the lower end of a gate electrode 15 toward the lower side of the FET in the direction perpendicular to the main surface of the substrate 100. The vertical axis indicates the electron energy (eV). In FIG. 8, the Al composition ratio of an electron supply layer 116 satisfies v=0.2, and the respective three calculation results obtained when the n-type impurity concentrations (Nd) of the electron supply layer 116 are $1 \times 10^{17}$ cm$^{-3}$ or less, $1 \times 10^{18}$ cm$^{-3}$, and $1 \times 10^{19}$ cm$^{-3}$ are shown. The parameters other than this are the same as those used in calculations for FIG. 2.

As can be seen from FIG. 8, the carrier density at the interface between the electron supply layer 116 and the spacer layer 115 is increased, and the conduction band barrier formed on the surface side of the electron supply layer becomes thin, with increasing the n-type impurity concentration Nd of the electron supply layer 116. Thus, the contact resistance is reduced. The carrier density at the interface between the barrier layer 114 and the channel layer 113 barely depends on the Nd. As shown in FIG. 8, even when the Nd is $1 \times 10^{17}$ cm$^{-3}$ or less, a certain amount of carriers is formed at the interface between the electron supply layer 116 and the spacer layer 115. From the viewpoint of reducing the on-state resistance in the FET of the present invention, the electron supply layer may be undoped or of an n-type. The electron supply layer is more preferably an n-type electron supply layer with the Nd of $1 \times 10^{18}$ cm$^3$ or more. With this electron supply layer, the contact resistance can be significantly reduced.

[Second Embodiment]

Figure 9:
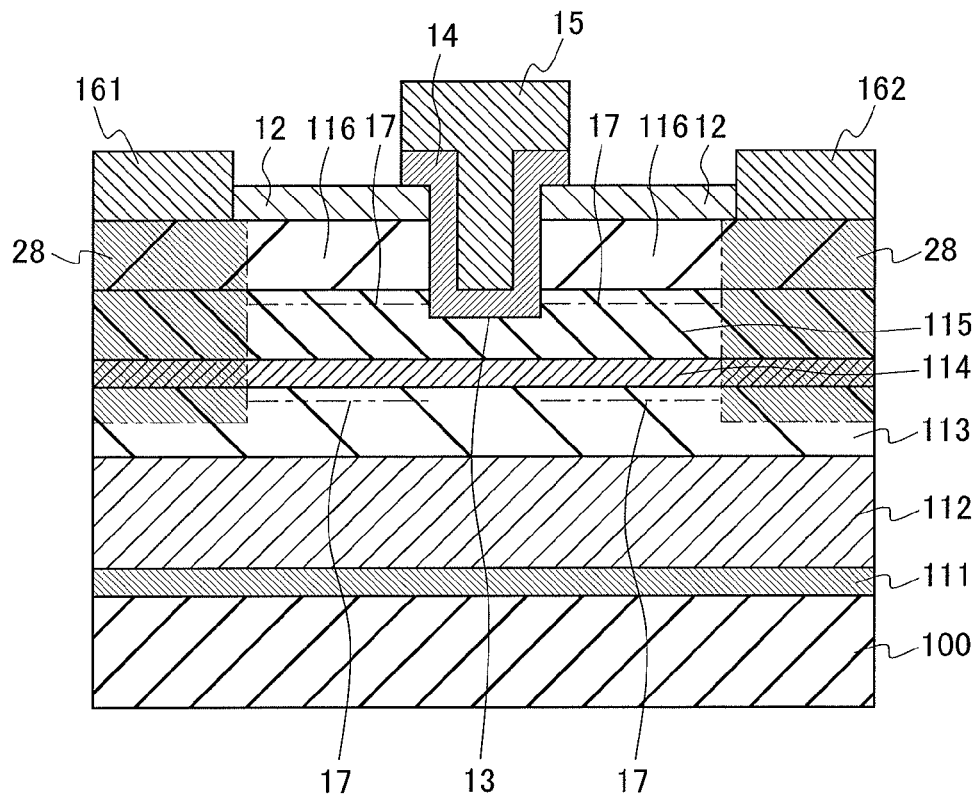
FIG. 9 is a cross-sectional view showing the structure of a FET according to the second embodiment of the present invention.

The cross-sectional view of FIG. 9 schematically shows the cross-sectional structure of a FET according to the second embodiment of the present invention. In FIG. 9, the numeral 28 represents an n-type impurity containing region (hereinafter also referred to as an n-type impurity addition region). The other numerals indicate the same as those indicated by the same numerals in FIGS. 1A and 1B. The FET according to the present embodiment (FIG. 9) is characterized in that an n-type impurity is added to parts or the whole of an electron supply layer 116, a spacer layer 115, a barrier layer 114, and a channel layer 113 under each of a source electrode 161 and a drain electrode 162. That is, as shown in the FET of FIG. 9, an n-type impurity containing region (n-type impurity addition region) 28 is formed from each of the lower surfaces of the source electrode 161 and drain electrode 162 to the inside of the channel layer 113 under each of the source electrode 161 and the drain electrode 162.

The FET having the structure of FIG. 9 can be produced as follows, for example. First, a nucleation layer 111, a buffer layer 112, a channel layer 113, a barrier layer 114, a spacer layer 115, and an electron supply layer 116 are laminated, in this order, on a substrate 100 in the same manner as for those of the FET of FIG. 1B. A resist pattern including an ion implantation region having an opening is formed in a semiconductor layer structure produced as described above by normal lithography. Thereafter, an n-type impurity such as Si is ion-implanted. The accelerating voltage of Si ions is selected from about 10 to 100 keV, for example. The implantation dose (effective dose) is selected from about $1 \times 10^{13}$ to $1 \times 10^{16}$ cm$^{-2}$, for example. Then, annealing treatment is conducted in order to activate the impurity. The temperature of the annealing is selected from 1000° C. to 1200° C., for example. As described above, the n-type impurity containing regions (n-type impurity addition regions) 28 can be formed (a step of forming an n-type impurity containing region). Thereafter, a source electrode 161 and a drain electrode 162, a surface protective film 12, a recess portion 13, a gate insulating film 14, and a gate electrode 15 are formed in the same manner as for those of the FET of FIG. 1B. Thus, the FET of FIG. 9 can be produced.

In the FET of FIG. 9, it is possible to significantly reduce contact resistances between the source electrode 161 and the channel layer 113 and between a drain electrode 162 and a channel layer 113 by forming the n-type impurity containing regions (n-type impurity addition regions) 28. As long as the n-type impurity addition regions are formed in the respective parts of the barrier layer 114 under the source electrode and the drain electrode, resistance components caused by the conduction band barrier formed in the barrier layer 114 is reduced, and the certain effect of reducing contact resistances can be obtained. More desirably, the n-type impurity addition regions are formed in the electron supply layer 116, the spacer layer 115, the barrier layer 114, and the channel layer 113 under the source electrode and the drain electrode. In this case, resistance components caused by the conduction band barrier formed in the electron supply layer 116 is also reduced, and the contact resistances can be further reduced.

As described above, in the FET of the present invention, it is preferred that the n-type impurity containing region is formed in at least a part under the source electrode and the drain electrode and includes at least a part of the barrier layer. Moreover, it is more preferred that the n-type impurity containing region is formed from each of the lower surfaces of the source electrode and the drain electrode to at least the inside of the channel layer. The n-type impurity containing region has an n-type impurity concentration of, for example, $10^{17}$ cm$^{-3}$ or more, preferably $10^{18}$ cm$^{-3}$ or more, more preferably $10^{19}$ cm$^{-3}$ or more. The upper limit of the n-type impurity concentration in the n-type impurity containing region is, for example, $10^{22}$ cm$^{-3}$ or less.

[Third Embodiment]

Figure 10:
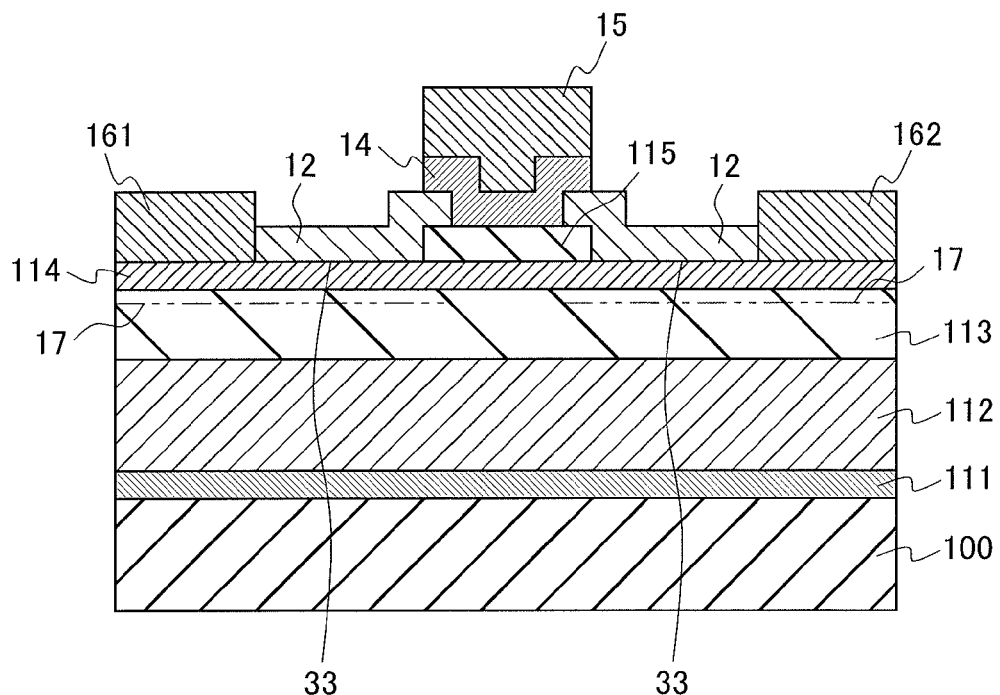
FIG. 10 is a cross-sectional view showing the structure of a FET according to the third embodiment of the present invention.

The cross-sectional view of FIG. 10 schematically shows the cross-sectional structure of a FET according to the third embodiment of the present invention. In FIG. 10, the numeral 33 represents an ohmic recess portion, and the other numerals indicate the same as those indicated by the same numerals in FIG. 1B.

The structure of the FET according to the present embodiment is described below. That is, first, this EFT does not include an electron supply layer 116 as shown in FIG. 10. The ohmic recess portion (concave portion) 33 is formed from the upper surface of a spacer layer 115 to the upper surface of a barrier layer 114 in a part the spacer layer 115 below a source electrode 161 and a drain electrode 162. The ohmic recess portion 33 of FIG. 10 may be formed by removing a part of the spacer layer 115 until the upper surface of the barrier layer 114 is exposed, for example. A method for removing a part of the spacer layer 115 may be, for example, etching. In FIG. 10, the ohmic recess portion 33 is a notch portion formed on each of the both ends of the spacer layer 115 and however is not limited to this. For example, the ohmic recess portion 33 may be an opening portion to be filled having the same shape as the recess portion 13 of FIG. 1B. A surface protective film 12 is formed not on the both ends of the upper surface of the barrier layer 114, but on the exposed upper surface (upper surfaces) of the barrier layer 114 and the spacer layer 115. A gate electrode 15 is formed on the surface of the spacer layer 115 exposed by removing a part of the surface protective film 12 by etching via an gate insulating film 14 so as to fill in. The source electrode 161 is in contact with one of the both ends on the upper surface of the barrier layer 114 on which the surface protective film 12 is not formed, and the drain electrode 162 is in contact with the other of the both ends. The source electrode 161 and the drain electrode 162 are arranged so as to face each other across the gate electrode 15.

The FET of FIG. 10 can be produced as follows, for example. As an example, the case where the Al composition ratio of the buffer layer 112 satisfies x=0.1, that of the channel layer 113 satisfies y=0.0, that of the barrier layer 114 satisfies z=1.0, and that of the spacer layer 115 satisfies u=0.0 is described below.

First, a nucleation layer 111 (200 nm) made of a superlattice obtained by laminating alternately undoped AlN and undoped GaN, a buffer layer 112 (1 μm) made of undoped $Al_{0.1}Ga_{0.9}N$, a channel layer 113 made of undoped GaN, a barrier layer 114 made of undoped AlN, and a spacer layer 115 made of undoped GaN are grown, in this order, on a silicon (Si) substrate 100 having a (111) plane by, for example, MOCVD (a step of laminating semiconductor layers). In this step, the crystal growth is growth on a Ga plane or an Al plane which is perpendicular to a (0001) crystal axis. The thickness of each of the GaN layer 113, the AlN layer 114, and the GaN layer 115 is less than the critical thickness at which a dislocation occurs on the $Al_{0.1}Ga_{0.9}N$ buffer layer. Thus, the occurrence of dislocation is suppressed, and favorable crystal quality can be obtained.

Undoped semiconductor layers are used as the semiconductor layers 112 to 115 The semiconductor layers 112 to 115 may be, for example, p-type or n-type semiconductor layers each with an impurity concentration of about $1 \times 10^{17}$ cm$^{-3}$ or less, for example.

Then, a resist pattern is formed in a semiconductor layer structure produced as described above by normal lithography, so that a region in which a gate electrode is formed is covered. Thereafter, for example, a part of the GaN spacer layer 115 is removed by etching with mixed gas of $BCl_3$ and oxygen ($O_2$), so that the upper surface of the AlN barrier layer 114 is exposed. Thus, an ohmic recess portion 33 is formed. The etching selectivity ratio between GaN and AlN can be 5 or more by appropriately selecting a gas flow ratio between $BCl_3$ and $O_2$, and the AlN layer 114 can be used as an etching stop layer.

Further, metals such as Ti/Al/Ni/Au are deposited on the AlN barrier layer 114 in the ohmic recess portions 33, which is then subjected to alloy treatment, for example. Thus, a source electrode 161 and a drain electrode 162 are formed and are in ohmic contact with the channel layer 113 (a step of forming a source electrode and a drain electrode). Then, for example, 50 nm of a surface protective film 12 made of an insulator such as silicon nitride ($Si_3N_4$) is deposited using PECVD, for example. An opening portion (opening portion to be filled) is formed on the GaN spacer layer 115 by etching the surface protective film 12 using reactive gas such as sulfur hexafluoride ($SF_6$), for example. Then, about 50 nm of a gate insulating film 14 such as $Al_2O_3$ is deposited so as to be filled in the opening portion, using ALD, for example. Furthermore, metals such as Ni/Au are deposited, and lift-off procedures are performed, so that a gate electrode 15 is formed (a step of forming a gate electrode). As described above, the FET of FIG. 10 can be produced.

In such a FET, the layer structure under the gate electrode (under the gate) is exactly the same as that of the first embodiment shown in FIGS. 1A and 1B. Therefore, a high $V_{th}$ can be achieved based on the same principle as in the first embodiment. 2DEG (17) is formed at the heterointerface between the AlGaN barrier layer 114 and the AlGaN channel layer 113. The heterointerface between the AlGaN barrier layer and the AlGaN channel layer is flat at the atomic layer level. Therefore, the mobility of electrons is increased, and the on-state resistance is reduced as in the first embodiment.

In the method for producing a FET of the present invention, described in the first embodiment, a gate electrode is formed so as to be in contact with the spacer layer exposed by removing an electron supply layer by etching. According to such a method, the thickness of the spacer layer under the gate electrode is determined depending on the depth of the recess formed by etching, and the $V_{th}$ may be changed depending on the fluctuation of the etching rate. In contrast, in the method for producing a FET of the present invention, described in the present embodiment, a gate electrode is formed on the topmost surface of the semiconductor layer structure, and ohmic electrodes are formed in the ohmic recess portion obtained by removing the spacer layer by etching. As described above, according to the structure of the FET according to the present embodiment, the thickness of the spacer layer under the gate electrode can be determined depending on only the epi structure (without the effect of the etching depth), and in-plane evenness and repeatability of the $V_{th}$ can be further enhanced. The methods for producing a FET in the first embodiment and the present embodiment are mere examples and are not limited thereby. Moreover, the characteristics of the FETs of the first embodiment and the present embodiment are not limited by the above description. For example, a FET with superior in-plane evenness and repeatability of the $V_{th}$ can be obtained by the means of appropriately controlling the etching rate or the like in the steps of producing the FET of the first embodiment.

In the present embodiment, an n-type impurity addition region may be formed in the channel layer 113 and the barrier layer 114 under each of the source electrode 161 and the drain electrode 162 as in the second embodiment. With the n-type impurity addition region, the contact resistance components caused by the conduction band barrier formed in the barrier layer are reduced, and the on-state resistance is further reduced as in the second embodiment.

[Fourth Embodiment]

Figure 11:
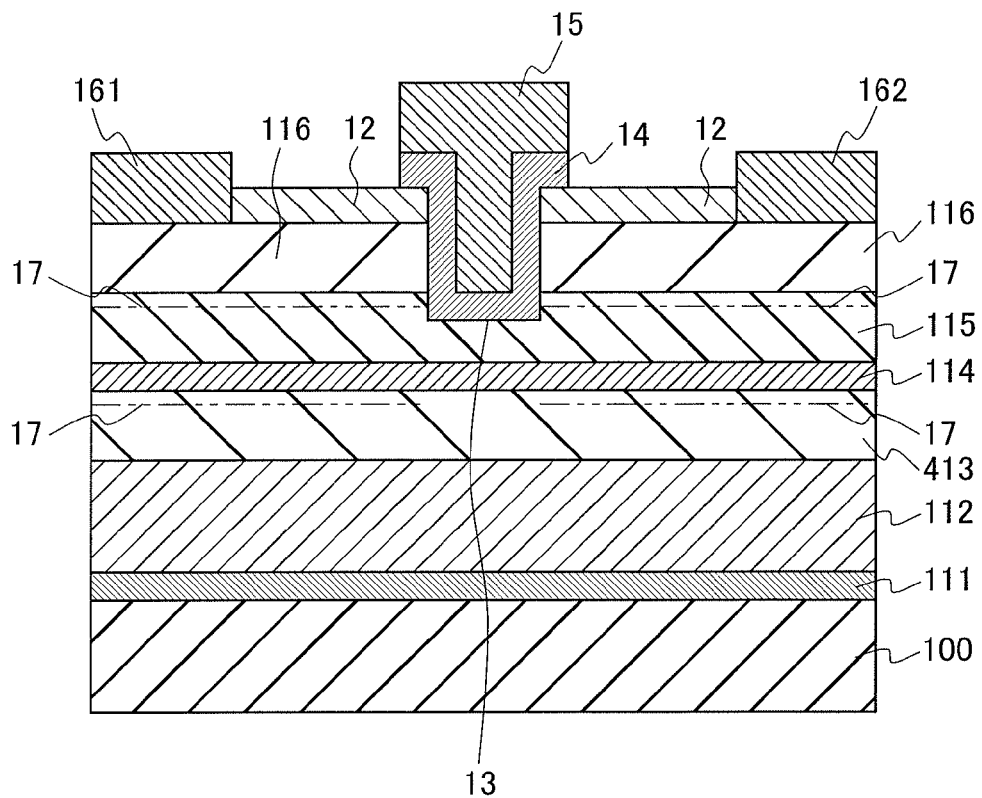
FIG. 11 is a cross-sectional view showing the structure of a FET according to the fourth embodiment of the present invention.

The cross-sectional view of FIG. 11 schematically shows the cross-sectional structure of a FET according to the fourth embodiment of the present invention. In FIG. 11, the numeral 413 represents a p-type AlGaN channel layer. The other numerals indicate the same as those indicated by the same numerals in FIG. 1B.

The FET of the present embodiment is characterized in that a p-type impurity is added to an AlGaN channel layer 413. As the p-type impurity, magnesium (Mg), zinc (Zn), or the like is used, for example. An appropriate concentration of the p-type impurity is about $1 \times 10^{17}$ cm$^{-3}$ or more to about $1 \times 10^{20}$ cm$^{-3}$ or less as an ionic concentration. The Al composition ratio y of a channel layer is less than that of the buffer layer ($0 \leq y < x$) as in the first embodiment. The structure of the FET of FIG. 11 is the same as that of the FET of FIG. 1B except that it includes an AlGaN channel layer 413 containing a p-type impurity as substitute for the AlGaN channel layer 113. A method for producing this FET is not particularly limited, and the FET can be produced in the same manner as for the FET of FIG. 1B except that a p-type impurity is added to the AlGaN channel layer 413.

In such a FET, negative fixed charges are generated by ionizing the p-type impurity in the channel layer. When the surface density of this negative fixed charges is represented by $-\sigma_p$, the sum of the fixed charges under the gate electrode is represented by $(-\sigma_3-\sigma_p)$. Therefore, negative fixed charges under the gate in pinch-off are increased, so that the $V_{th}$ is increased. Thus, a normally-off operation can be achieved more easily.

In the present embodiment, a p-type impurity is added to the channel layer 413. A p-type impurity may be added to any of semiconductor layers such as a buffer layer 112, a barrier layer 114, and a spacer layer 115 as long as the semiconductor layers are below the gate electrode. That is, for example, in the FET of FIG. 1B, at least one (at least a part) of the buffer layer 112, the channel layer 113, the barrier layer 114, and the spacer layer 115 may contain a p-type impurity.

FIG. 11 shows an example of introducing a p-type impurity addition layer (p-type impurity containing layer) into the FET of the first embodiment. The same effect can be obtained by introducing a p-type impurity addition layer into any of the FETs of the other embodiments. For example, in the case of the second embodiment, a p-type impurity may be added to at least parts of the buffer layer 112, the channel layer 113, the barrier layer 114, and the spacer layer 115 below the gate electrode. In the case of the third embodiment, a p-type impurity may be added to at least parts of the buffer layer 112, the channel layer 113, the barrier layer 114, and the spacer layer 115 below the gate electrode.

In the present embodiment, an n-type impurity addition region (n-type impurity containing region) may be formed in the electron supply layer 116, the spacer layer 115, the barrier layer 114, the channel layer 413 under each of the source electrode 161 and the drain electrode 162 as in the second embodiment. With the n-type impurity addition region, the contact resistance components caused by the conduction band barriers formed in the electron supply layer and the barrier layer are reduced, and the on-state resistance is further reduced as in the second embodiment.

[Fifth Embodiment]

The fifth embodiment of the FET of the present invention is described below.

As the first to fourth embodiments, embodiments in each of which group-III elements contained in a laminate structure including the buffer layer, the channel layer, the barrier layer, and the spacer layer are gallium (Ga) and aluminum (Al) are described. As the following fifth to fourteenth embodiments, embodiments in each of which the laminate structure contains indium (In) are described. The fifth to fourteenth embodiments are embodiments of the second field effect transistor of the present invention.

Figure 12:
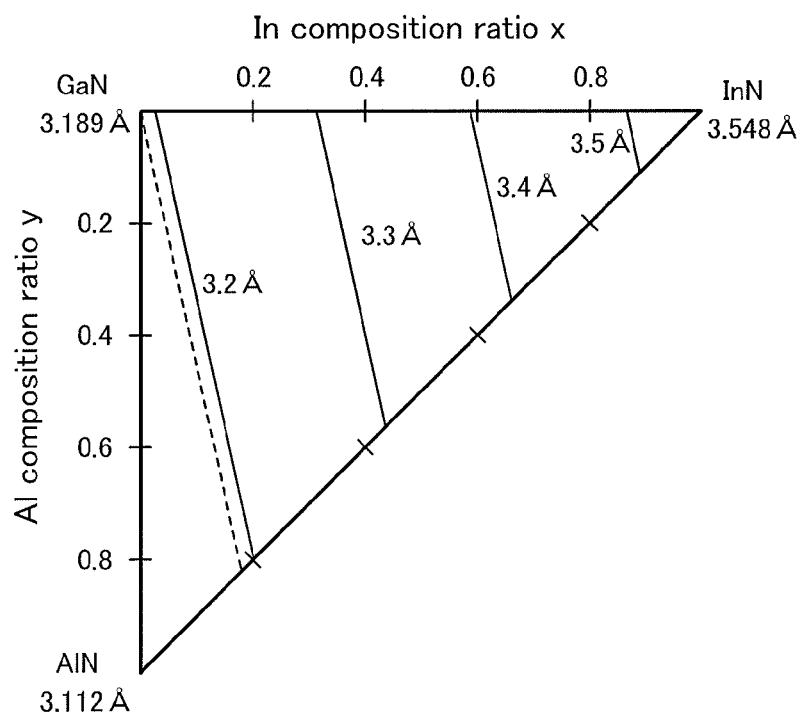
FIG. 12 is a contour plot of the a-axis length of a group-III nitride semiconductor with the composition represented by $In_xAl_yGa_{1-x-y}N$.

Prior to the description of the fifth to fourteenth embodiments, an a axis length of the group-III nitride semiconductor represented by the composition of $In_xAl_yGa_{1-x-y}N$ shown in a graph (contour plot) of FIG. 12 is described. As shown in FIG. 12, the a axis length of $In_xAl_yGa_{1-x-y}N$ is represented by the following mathematical formula (3). In the following mathematical formula (3), a (x, y) represents the a axis length, and the unit of a (x, y) is Å. It is to be noted that 1 Å is equal to $10^{-10}$ m which is 0.1 nm.

$$a(x,y)=3.548x+3.112y+3.189(1-x-y) \quad (3)$$

Figure 13:
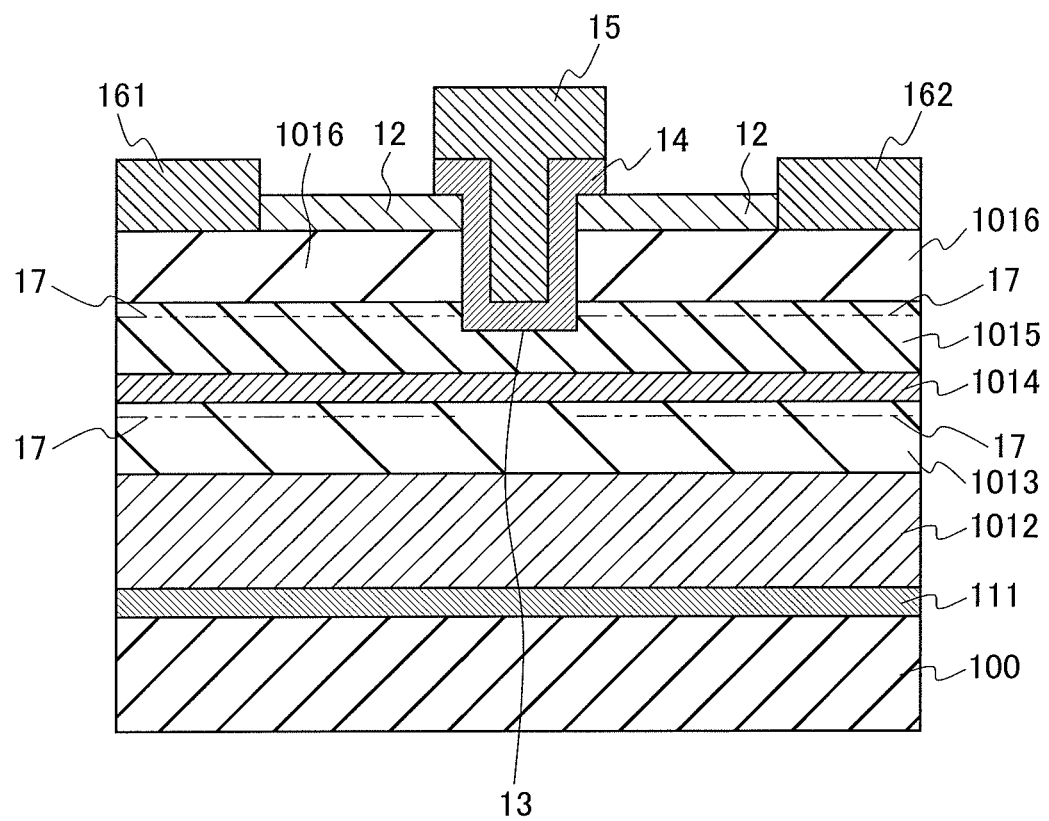
FIG. 13 is a cross-sectional view showing the structure of a FET according to the fifth embodiment of the present invention.

The cross-sectional view of FIG. 13 schematically shows the cross-sectional structure of a FET according to the fifth embodiment of the present invention. In FIG. 13, the numeral 1012 indicates a buffer layer, the numeral 1013 indicates a channel layer, the numeral 1014 indicates a barrier layer, the numeral 1015 indicates a spacer layer, and the numeral 1016 indicates an electron supply layer. The other numerals indicate the same as those indicated by the same numerals in FIG. 1B. As shown in FIG. 13, this FET has the same structure as the FET of FIG. 1B except that it has a laminate structure obtained by laminating a buffer layer 1012, a channel layer 1013, a barrier layer 1014, a spacer layer 1015, and an electron supply layer 1016 in this order as substitute for the laminate structure including a buffer layer 112, a channel layer 113, a barrier layer 114, a spacer layer 115, and an electron supply layer 116. The composition of each of the buffer layer 1012, the channel layer 1013, the barrier layer 1014, the spacer layer 1015, and the electron supply layer 1016 is as follows.

1012: $In_{x1}Al_{x2}Ga_{1-x1-x2}N$ buffer layer
(a axis length: a (x1, x2))
1013: $In_{y1}Al_{y2}Ga_{1-y1-y2}N$ channel layer
(a axis length: a (y1, y2))
1014: $In_{z1}Al_{z2}Ga_{1-z1-z2}N$ barrier layer
(a axis length: a (z1, z2))
1015: $In_{u1}Al_{u2}Ga_{1-u1-u2}N$ spacer layer
(a axis length: a (u1, u2))
1016: $In_{v1}Al_{v2}Ga_{1-v1-v2}N$ electron supply layer
(a axis length: a (v1, v2))

It is to be noted that the composition ratios are set so that the buffer layer 1012, the channel layer 1013, the barrier layer 1014, the spacer layer 1015, and the electron supply layer 1016 satisfy the following mathematical formulae (4) to (7) based on the mathematical formula (3) and FIG. 12. This causes a compressive strain to be generated in the channel layer, a tensile strain to be generated in the barrier layer, and a compressive strain to be generated in the spacer layer. Thus, the effects of increasing the $V_{th}$ and reducing the on-state resistance can be obtained as in the first embodiment.

$$a(x1,x2)<a(y1,y2) \quad (4)$$

$$a(z1,z2)<a(x1,x2) \quad (5)$$

$$a(x1,x2)<a(u1,u2) \quad (6)$$

$$a(v1,v2)<a(x1,x2) \quad (7)$$

[Sixth Embodiment]

Figure 14:
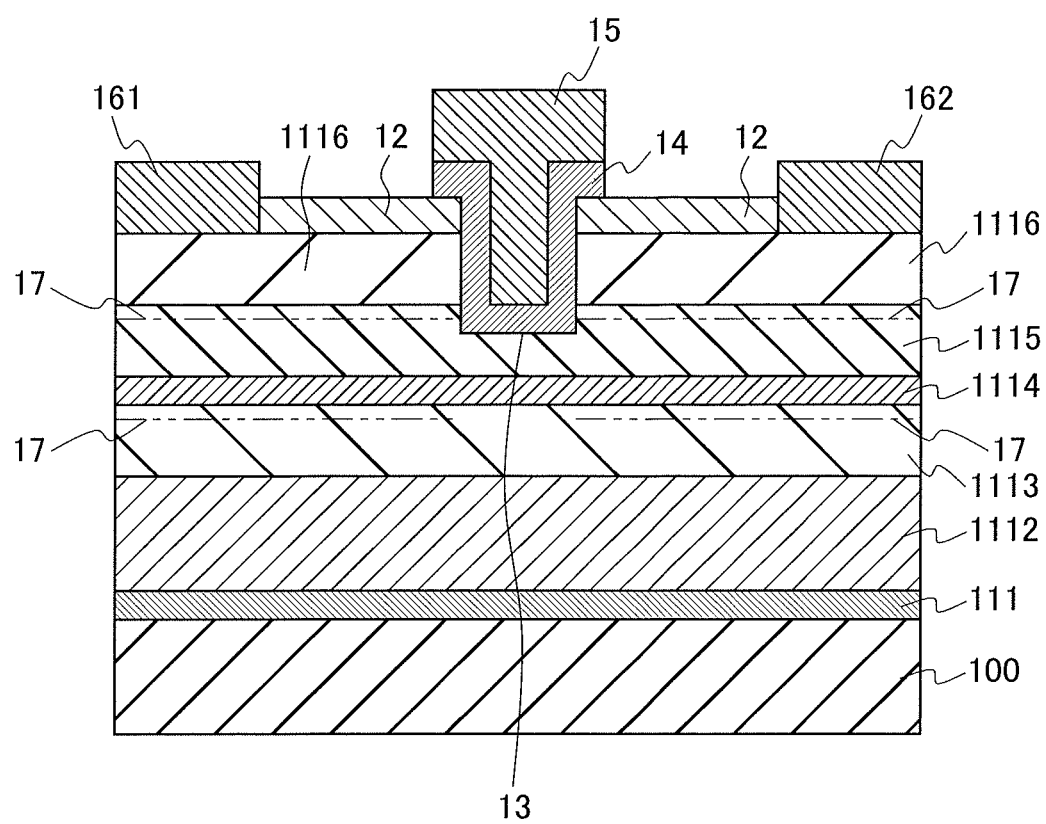
FIG. 14 is a cross-sectional view showing the structure of a FET according to the sixth embodiment of the present invention.

The cross-sectional view of FIG. 14 schematically shows the cross-sectional structure of a FET according to the sixth embodiment of the present invention. In FIG. 14, the numeral 1112 indicates a buffer layer, the numeral 1113 indicates a channel layer, the numeral 1114 indicates a barrier layer, the numeral 1115 indicates a spacer layer, and the numeral 1116 indicates an electron supply layer. The other numerals indicate the same as those indicated by the same numerals in FIG. 1B. As shown in FIG. 14, this FET has the same structure as the FET of FIG. 1B except that it has a laminate structure obtained by laminating a buffer layer 1112, a channel layer 1113, a barrier layer 1114, a spacer layer 1115, and an electron supply layer 1116 in this order as substitute for the laminate structure including a buffer layer 112, a channel layer 113, a barrier layer 114, a spacer layer 115, and an electron supply layer 116. The composition of each of the buffer layer 1112, the channel layer 1113, the barrier layer 1114, the spacer layer 1115, and the electron supply layer 1116 is as follows.

1112: $Al_xGa_{1-x}N$ buffer layer (a axis length: a (0, x))
1113: $In_yAl_{1-y}N$ channel layer (a axis length: a (y, 1-y))
1114: $Al_zGa_{1-z}N$ barrier layer (a axis length: a (0, z))
1115: $In_uAl_{1-u}N$ spacer layer (a axis length: a (u, 1-u))
1116: $Al_vGa_{1-v}N$ electron supply layer (a axis length: a (0, v))

It is to be noted that the composition ratios are set so that the buffer layer 1112, the channel layer 1113, the barrier layer 1114, the spacer layer 1115, and the electron supply layer 1116 satisfy the mathematical formulae (8) to (12) (e.g., x=0.1, y=u=0.18, z=1.0, v=0.2).

$$0 \leq x < 1 \tag{8}$$

$$-0.177x + 0.177 < y \tag{9}$$

$$x < z \tag{10}$$

$$-0.177x + 0.177 < u \tag{11}$$

$$x < v \tag{12}$$

As can be seen from the mathematical formula (3) and FIG. 12, the following mathematical formulae (13) to (16) hold when the mathematical formulae (8) to (12) are satisfied. This causes a compressive strain to be generated in the channel layer, a tensile strain to be generated in the barrier layer, and a compressive strain to be generated in the spacer layer. Thus, the effects of increasing the $V_{th}$ and reducing the on-state resistance can be obtained as in the first embodiment.

$$a(0,x) < a(y, 1-y) \tag{13}$$

$$a(0,z) < a(0,x) \tag{14}$$

$$a(0,x) < a(u, 1-u) \tag{15}$$

$$a(0,v) < a(0,x) \tag{16}$$

[Seventh Embodiment]

Figure 15:
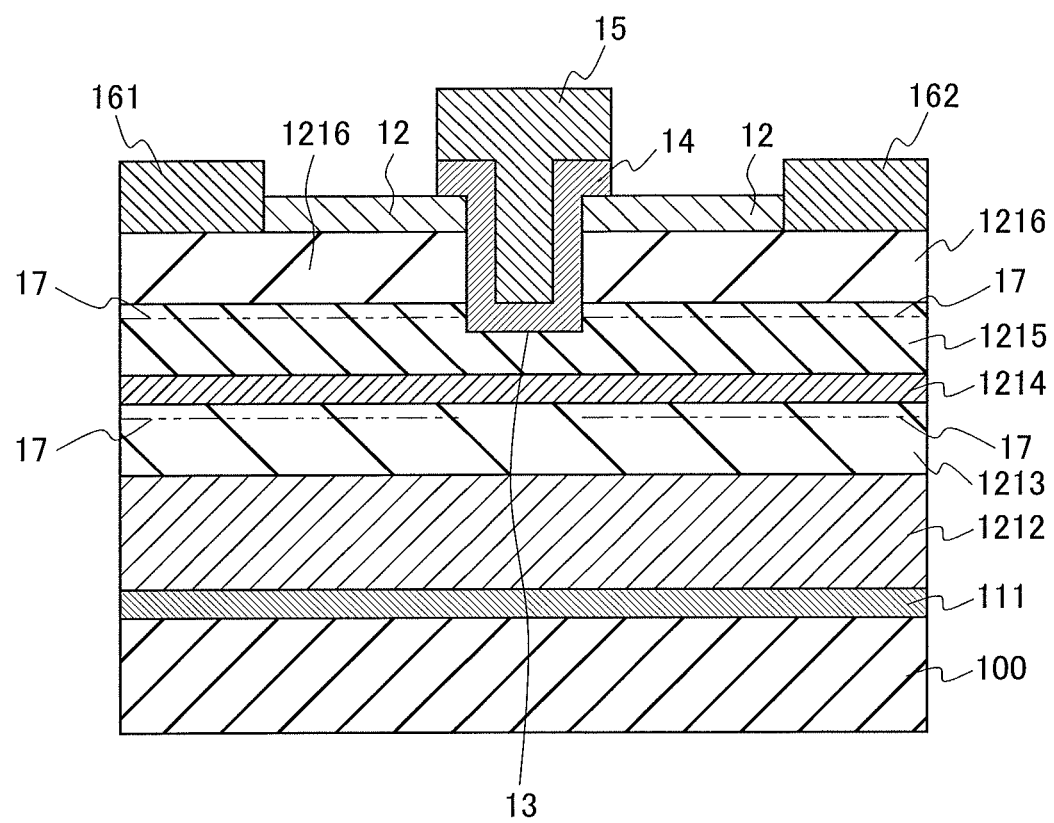
FIG. 15 is a cross-sectional view showing the structure of a FET according to the seventh embodiment of the present invention.

The cross-sectional view of FIG. 15 schematically shows the cross-sectional structure of a FET according to the seventh embodiment of the present invention. In FIG. 15, the numeral 1212 indicates a buffer layer, the numeral 1213 indicates a channel layer, the numeral 1214 indicates a barrier layer, the numeral 1215 indicates a spacer layer, and the numeral 1216 indicates an electron supply layer. The other numerals indicate the same as those indicated by the same numerals in FIG. 1B. As shown in FIG. 15, this FET has the same structure as the FET of FIG. 1B except that it has a laminate structure obtained by laminating a buffer layer 1212, a channel layer 1213, a barrier layer 1214, a spacer layer 1215, and an electron supply layer 1216 in this order as substitute for the laminate structure including a buffer layer 112, a channel layer 113, a barrier layer 114, a spacer layer 115, and an electron supply layer 116. The composition of each of the buffer layer 1212, the channel layer 1213, the barrier layer 1214, the spacer layer 1215, and the electron supply layer 1216 is as follows.

1212: $Al_xGa_{1-x}N$ buffer layer (a axis length: a (0, x))
1213: $In_yGa_{1-y}N$ channel layer (a axis length: a (y, 0))
1214: $Al_zGa_{1-z}N$ barrier layer (a axis length: a (0, z))
1215: $In_uGa_{1-u}N$ spacer layer (a axis length: a (u, 0))
1216: $Al_vGa_{1-v}N$ electron supply layer (a axis length: a (0, v))

It is to be noted that the composition ratios are set so that the buffer layer 1212, the channel layer 1213, the barrier layer 1214, the spacer layer 1215, and the electron supply layer 1216 satisfy the following mathematical formulae (17) to (21) (e.g., x=0.0, y=u=0.05, z=1.0, v=0.2).

$$0 \leq x < 1 \tag{17}$$

$$0 < y \tag{18}$$

$$x < z \tag{19}$$

$$0 < u \tag{20}$$

$$x < v \tag{21}$$

As can be seen from the mathematical formula (3) and FIG. 12, the following mathematical formulae (22) to (25) hold when the mathematical formulae (17) to (21) are satisfied. This causes a compressive strain to be generated in the channel layer, a tensile strain to be generated in the barrier layer, and a compressive strain to be generated in the spacer layer. Thus, the effects of increasing the $V_{th}$ and reducing the on-state resistance can be obtained as in the first embodiment.

$$a(0,x) < a(y,0) \tag{22}$$

$$a(0,z) < a(0,x) \tag{23}$$

$$a(0,x) < a(u,0) \tag{24}$$

$$a(0,v) < a(0,x) \tag{25}$$

[Eighth Embodiment]

Figure 16:
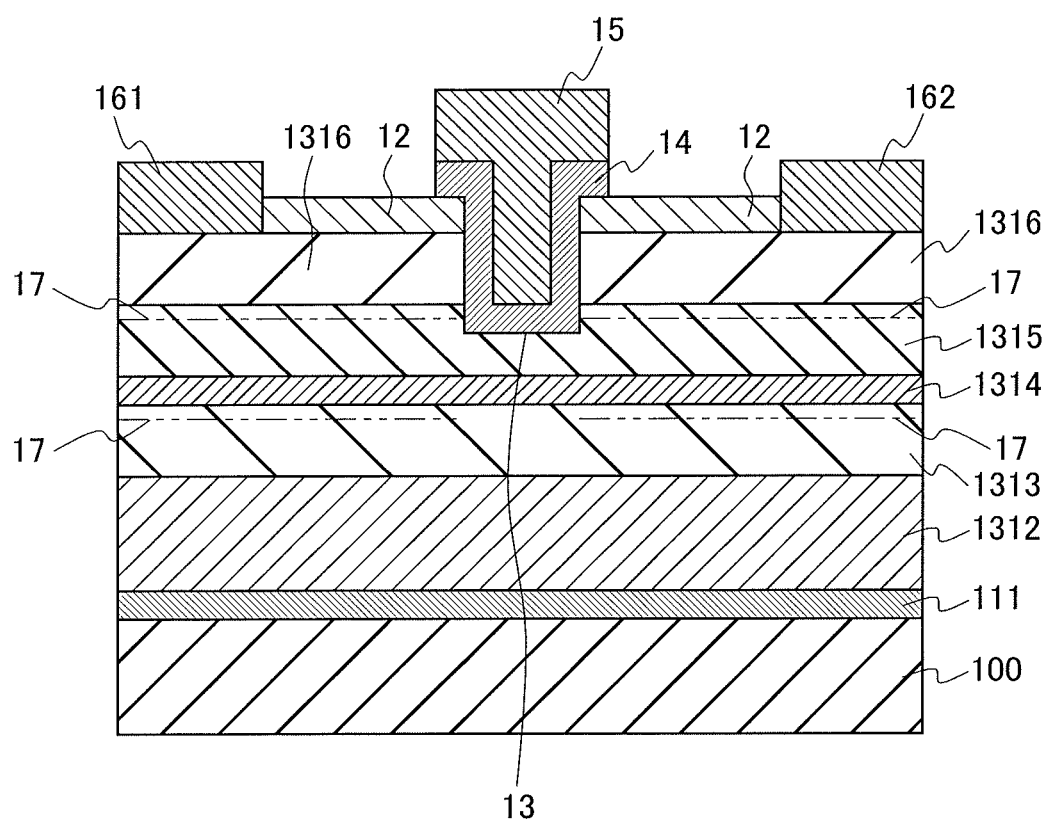
FIG. 16 is a cross-sectional view showing the structure of a FET according to the eighth embodiment of the present invention.

The cross-sectional view of FIG. 16 schematically shows the cross-sectional structure of a FET according to the eighth embodiment of the present invention. In FIG. 16, the numeral 1312 indicates a buffer layer, the numeral 1313 indicates a channel layer, the numeral 1314 indicates a barrier layer, the numeral 1315 indicates a spacer layer, and the numeral 1316 indicates an electron supply layer. The other numerals indicate the same as those indicated by the same numerals in FIG. 1B. As shown in FIG. 16, this FET has the same structure as the FET of FIG. 1B except that it has a laminate structure obtained by laminating a buffer layer 1312, a channel layer 1313, a barrier layer 1314, a spacer layer 1315, and an electron supply layer 1316 in this order as substitute for the laminate structure including a buffer layer 112, a channel layer 113, a barrier layer 114, a spacer layer 115, an electron supply layer 116. The composition of each of the buffer layer 1312, the channel layer 1313, the barrier layer 1314, the spacer layer 1315, and the electron supply layer 1316 is as follows.

1312: $In_xAl_{1-x}N$ buffer layer (a axis length: a (x, 1-x))
1313: $In_yAl_{1-y}N$ channel layer (a axis length: a (y, 1-y))
1314: $Al_zGa_{1-z}N$ barrier layer (a axis length: a (0, z))
1315: $In_uAl_{1-u}N$ spacer layer (a axis length: a (u, 1-u))
1316: $Al_vGa_{1-v}N$ electron supply layer (a axis length: a (0, v))

It is to be noted that the composition ratios are set so that the buffer layer 1312, the channel layer 1313, the barrier layer 1314, the spacer layer 1315, and the electron supply layer 1316 satisfy the following mathematical formulae (26) to (30) (e.g., x=0.18, y=u=0.23, z=1.0, v=0.2).

$$0 < x < 1 \tag{26}$$

$$x < y \tag{27}$$

$$-0.177z + 0.177 < x \tag{28}$$

$$x < u \tag{29}$$

$$-0.177v + 0.177 < x \tag{30}$$

As can be seen from the mathematical formula (3) and FIG. 12, the following mathematical formulae (31) to (34) hold when the mathematical formulae (26) to (30) are satisfied.

This causes a compressive strain to be generated in the channel layer, a tensile strain to be generated in the barrier layer, and a compressive strain to be generated in the spacer layer. Thus, the effects of increasing the $V_{th}$ and reducing the on-state resistance can be obtained as in the first embodiment.

$$a(x,1-x) < a(y,1-y) \quad (31)$$

$$a(0,z) < a(x,1-x) \quad (32)$$

$$a(x,1-x) < a(u,1-u) \quad (33)$$

$$a(0,v) < a(x,1-x) \quad (34)$$

[Ninth Embodiment]

Figure 17:
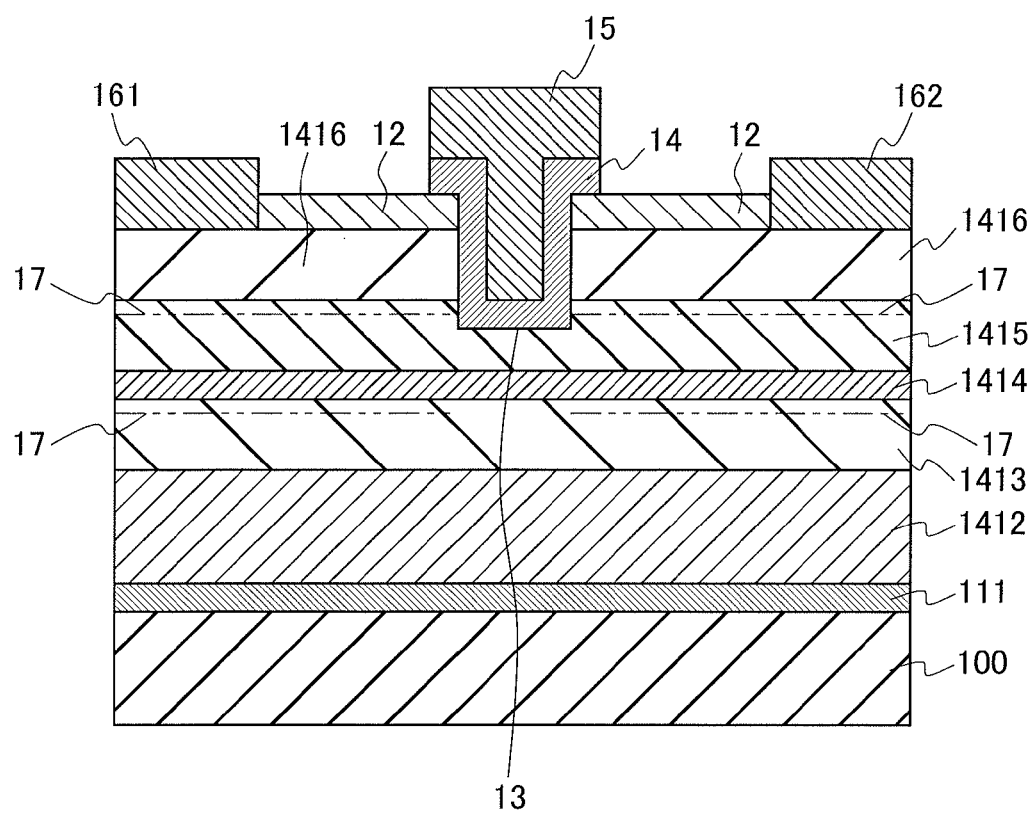
FIG. 17 is a cross-sectional view showing the structure of a FET according to the ninth embodiment of the present invention.

The cross-sectional view of FIG. 17 schematically shows the cross-sectional structure of a FET according to the ninth embodiment of the present invention. In FIG. 17, the numeral 1412 indicates a buffer layer, the numeral 1413 indicates a channel layer, the numeral 1414 indicates a barrier layer, the numeral 1415 indicates a spacer layer, and the numeral 1416 indicates an electron supply layer. The other numerals indicate the same as those indicated by the same numerals in FIG. 1B. As shown in FIG. 17, this FET has the same structure as the FET of FIG. 1B except that it has a laminate structure obtained by laminating a buffer layer 1412, a channel layer 1413, a barrier layer 1414, a spacer layer 1415, and an electron supply layer 1416 in this order as substitute for the laminate structure including a buffer layer 112, a channel layer 113, a barrier layer 114, a spacer layer 115, and an electron supply layer 116. The composition of each of the buffer layer 1412, the channel layer 1413, the barrier layer 1414, the spacer layer 1415, and the electron supply layer 1416 is as follows.

1412: $In_xAl_{1-x}N$ buffer layer (a axis length: a (x, 1−x))
1413: $In_yGa_{1-y}N$ channel layer (a axis length: a (y, 0))
1414: $Al_zGa_{1-z}N$ barrier layer (a axis length: a (0, z))
1415: $In_uGa_{1-u}N$ spacer layer (a axis length: a (u, 0))
1416: $Al_vGa_{1-v}N$ electron supply layer (a axis length: a (0, v))

It is to be noted that the composition ratios are set so that the buffer layer 1412, the channel layer 1413, the barrier layer 1414, the spacer layer 1415, and the electron supply layer 1416 satisfy the following mathematical formulae (35) to (39) (e.g., x=0.18, y=u=0.05, z=1.0, v=0.2).

$$0 < x < 1 \quad (35)$$

$$1.215x - 0.215 < y \quad (36)$$

$$-0.177z + 0.177 < x \quad (37)$$

$$1.215x - 0.215 < u \quad (38)$$

$$-0.177v + 0.177 < x \quad (39)$$

As can be seen from the mathematical formula (3) and FIG. 12, the following mathematical formulae (40) to (43) hold when the mathematical formulae (35) to (39) are satisfied. This causes a compressive strain to be generated in the channel layer, a tensile strain to be generated in the barrier layer, and a compressive strain to be generated in the spacer layer. Thus, the effects of increasing the $V_{th}$ and reducing the on-state resistance can be obtained as in the first embodiment.

$$a(x,1-x) < a(y,0) \quad (40)$$

$$a(0,z) < a(x,1-x) \quad (41)$$

$$a(x,1-x) < a(u,0) \quad (42)$$

$$a(0,v) < a(x,1-x) \quad (43)$$

[Tenth Embodiment]

Figure 18:
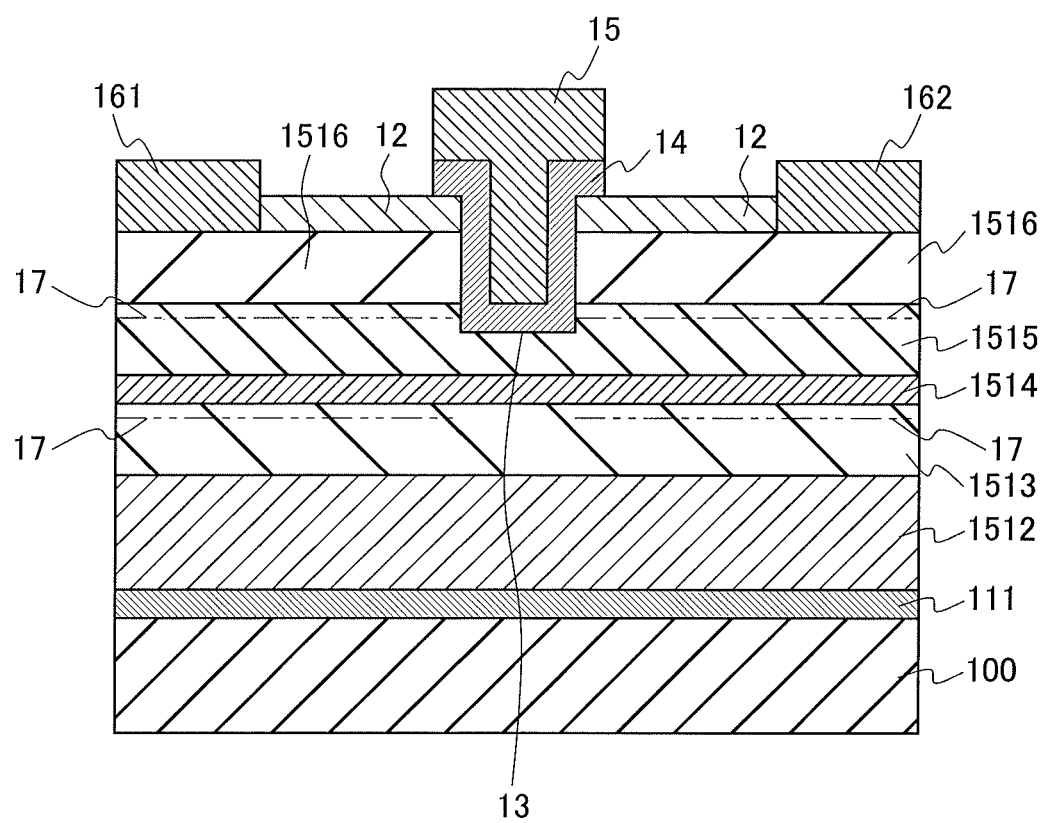
FIG. 18 is a cross-sectional view showing the structure of a FET according to the tenth embodiment of the present invention.

The cross-sectional view of FIG. 18 schematically shows the cross-sectional structure of a FET according to the tenth embodiment of the present invention. In FIG. 18, the numeral 1512 indicates a buffer layer, the numeral 1513 indicates a channel layer, the numeral 1514 indicates a barrier layer, the numeral 1515 indicates a spacer layer, and the numeral 1516 indicates an electron supply layer. The other numerals indicate the same as those indicated by the same numerals in FIG. 1B As shown in FIG. 18, this FET has the same structure as the FET of FIG. 1B except that it has a laminate structure obtained by laminating a buffer layer 1512, a channel layer 1513, a barrier layer 1514, a spacer layer 1515, and an electron supply layer 1516 in this order as substitute for the laminate structure including a buffer layer 112, a channel layer 113, a barrier layer 114, a spacer layer 115, and an electron supply layer 116. The composition of each of the buffer layer 1512, the channel layer 1513, the barrier layer 1514, the spacer layer 1515, and the electron supply layer 1516 is as follows.

1512: $In_xGa_{1-x}N$ buffer layer (a axis length: a (x, 0))
1513: $In_yGa_{1-y}N$ channel layer (a axis length: a (y, 0))
1514: $Al_zGa_{1-z}N$ barrier layer (a axis length: a (0, z))
1515: $In_uGa_{1-u}N$ spacer layer (a axis length: a (u, 0))
1516: $Al_vGa_{1-v}N$ electron supply layer (a axis length: a (0, v))

It is to be noted that the composition ratios are set so that the buffer layer 1512, the channel layer 1513, the barrier layer 1514, the spacer layer 1515, and the electron supply layer 1516 satisfy the following mathematical formulae (44) to (48) (e.g., x=0.05, y=u=0.1, z=1.0, v=0.2).

$$0 \le x < 1 \quad (44)$$

$$x < y \quad (45)$$

$$0 < z \quad (46)$$

$$x < u \quad (47)$$

$$0 < v \quad (48)$$

As can be seen from the mathematical formula (3) and FIG. 12, the following mathematical formulae (49) to (52) hold when the mathematical formulae (44) to (48) are satisfied. This causes a compressive strain to be generated in the channel layer, a tensile strain to be generated in the barrier layer, and a compressive strain to be generated in the spacer layer. Thus, the effects of increasing the $V_{th}$ and reducing the on-state resistance can be obtained as in the first embodiment.

$$a(x,0) < a(y,0) \quad (49)$$

$$a(0,z) < a(x,0) \quad (50)$$

$$a(x,0) < a(u,0) \quad (51)$$

$$a(0,v) < a(x,0) \quad (52)$$

[Eleventh Embodiment]

Figure 19:
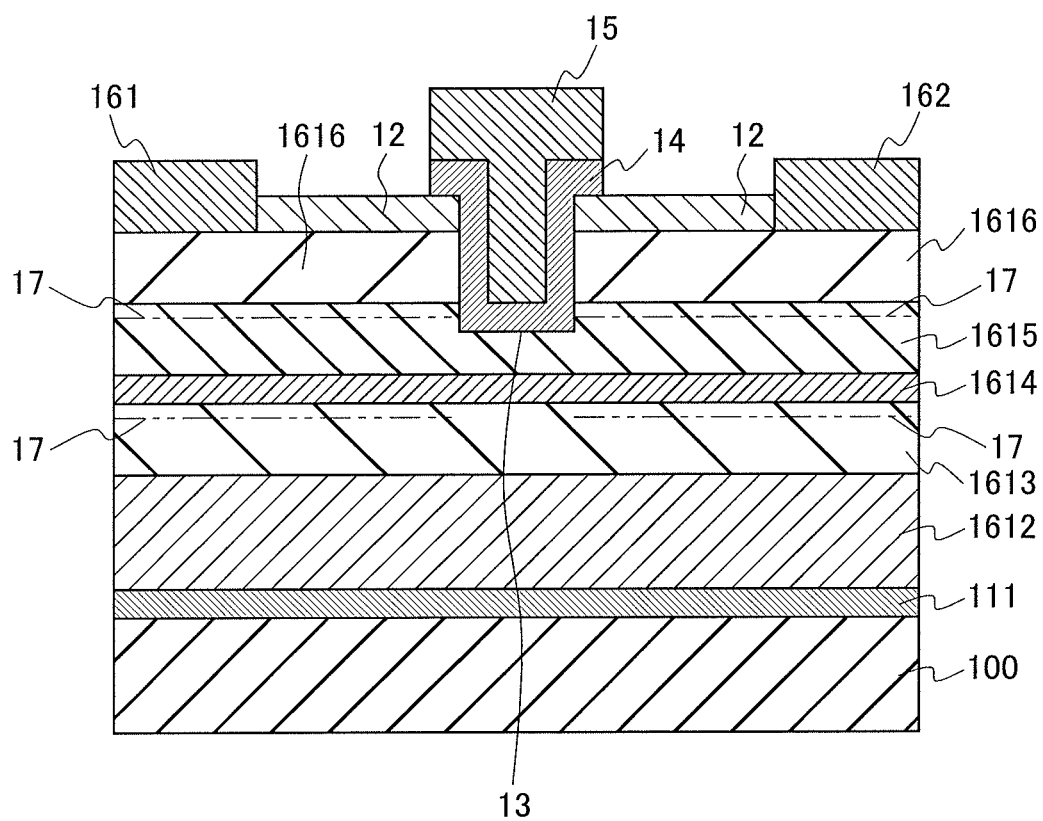
FIG. 19 is a cross-sectional view showing the structure of a FET according to the eleventh embodiment of the present invention.

The cross-sectional view of FIG. 19 schematically shows the cross-sectional structure of a FET according to the eleventh embodiment of the present invention. In FIG. 19, the numeral 1612 indicates a buffer layer, the numeral 1613 indicates a channel layer, the numeral 1614 indicates a barrier layer, the numeral 1615 indicates a spacer layer, and the numeral 1616 indicates an electron supply layer. The other numerals indicate the same as those indicated by the same numerals in FIG. 1B. As shown in FIG. 19, this FET has the same structure as the FET of FIG. 1B except that it has a laminate structure obtained by laminating a buffer layer 1612, a channel layer 1613, a barrier layer 1614, a spacer layer 1615, and an electron supply layer 1616 in this order as substitute for the laminate structure including a buffer layer 112, a channel layer 113, a barrier layer 114, a spacer layer 115, and a electron supply layer 116. The composition of each of the buffer layer 1612, the channel layer 1613, the barrier layer 1614, the spacer layer 1615, and the electron supply layer 1616 is as follows.

1612: $In_xAl_{1-x}N$ buffer layer (a axis length: a (x, 1−x))
1613: $In_yAl_{1-y}N$ channel layer (a axis length: a (y, 1−y))
1614: $In_zAl_{1-z}N$ barrier layer (a axis length: a (z, 1−z))
1615: $In_uAl_{1-u}N$ spacer layer (a axis length: a (u, 1−u))
1616: $In_vAl_{1-v}N$ electron supply layer (a axis length: a (v, 1−v))

It is to be noted that the composition ratios are set so that the buffer layer 1612, the channel layer 1613, the barrier layer 1614, the spacer layer 1615, and the electron supply layer 1616 satisfy the following mathematical formulae (53) to (57) (e.g., x=0.18, y=u=0.23, z=0.08, v=0.13).

$$0<x<1 \tag{53}$$

$$x<y \tag{54}$$

$$z<x \tag{55}$$

$$x<u \tag{56}$$

$$v<x \tag{57}$$

As can be seen from the mathematical formula (3) and FIG. 12, the following mathematical formulae (58) to (61) hold when the mathematical formulae (53) to (57) are satisfied. This causes a compressive strain to be generated in the channel layer, a tensile strain to be generated in the barrier layer, and a compressive strain to be generated in the spacer layer. Thus, the effects of increasing the $V_{th}$ and reducing the on-state resistance can be obtained as in the first embodiment.

$$a(x,1-x)<a(y,1-y) \tag{58}$$

$$a(z,1-z)<a(x,1-x) \tag{59}$$

$$a(x,1-x)<a(u,1-u) \tag{60}$$

$$a(v,1-v)<a(x,1-x) \tag{61}$$

[Twelfth Embodiment]

Figure 20:
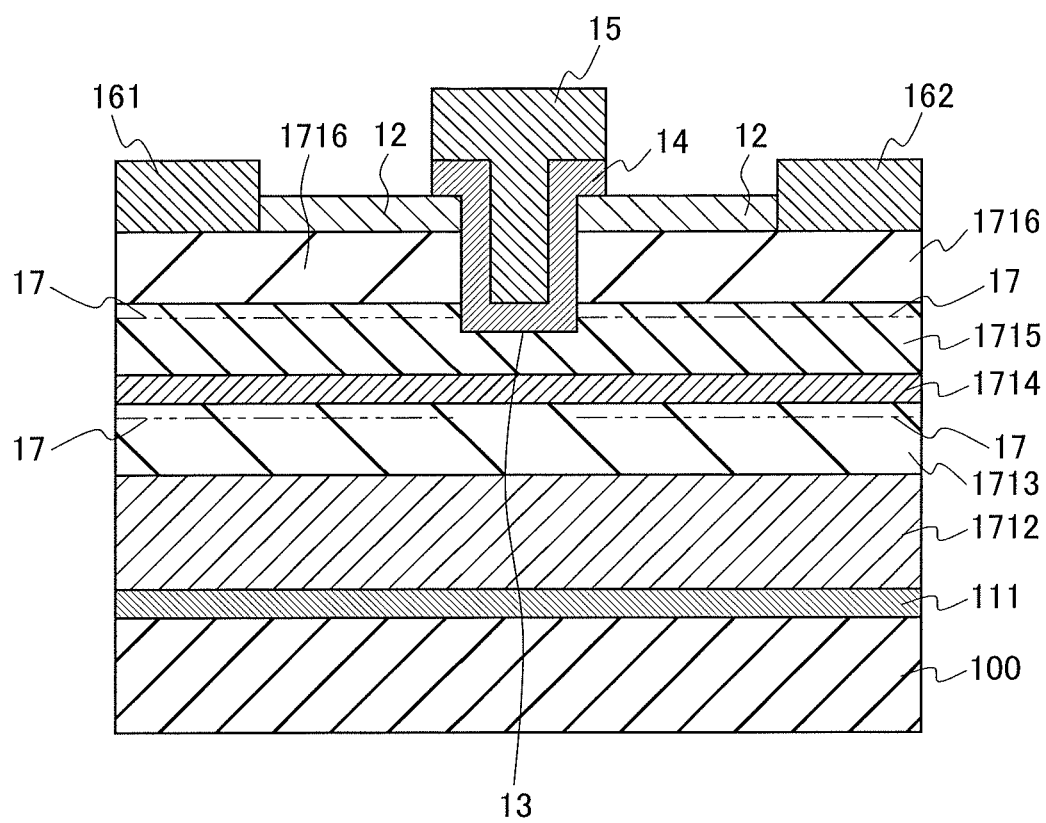
FIG. 20 is a cross-sectional view showing the structure of a FET according to the twelfth embodiment of the present invention.

The cross-sectional view of FIG. 20 schematically shows the cross-sectional structure of a FET according to the twelfth embodiment of the present invention. In FIG. 20, the numeral 1712 indicates a buffer layer, the numeral 1713 indicates a channel layer, the numeral 1714 indicates a barrier layer, the numeral 1715 indicates a spacer layer, and the numeral 1716 indicates an electron supply layer. The other numerals indicate the same as those indicated by the same numerals in FIG. 1B. As shown in FIG. 20, this FET has the same structure as the FET of FIG. 1B except that it has a laminate structure obtained by laminating a buffer layer 1712, a channel layer 1713, a barrier layer 1714, a spacer layer 1715, and an electron supply layer 1716 in this order as substitute for a laminate structure including a buffer layer 112, a channel layer 113, a barrier layer 114, a spacer layer 115, and an electron supply layer 116. The composition of each of the buffer layer 1712, the channel layer 1713, the barrier layer 1714, the spacer layer 1715, and the electron supply layer 1716 is as follows.

1712: $In_xAl_{1-x}N$ buffer layer (a axis length: a (x, 1−x))
1713: $In_yGa_{1-y}N$ channel layer (a axis length: a (y, 0))
1714: $In_zAl_{1-z}N$ barrier layer (a axis length: a (z, 1−z))
1715: $In_uGa_{1-u}N$ spacer layer (a axis length: a (u, 0))
1716: $In_vAl_{1-v}N$ electron supply layer (a axis length: a (v, 1−v))

It is to be noted that the composition ratios are set so that the buffer layer 1712, the channel layer 1713, the barrier layer 1714, the spacer layer 1715, and the electron supply layer 1716 satisfy the following mathematical formulae (62) to (66) (e.g., x=0.18, y=u=0.05, z=0.08, v=0.13).

$$0<x<1 \tag{62}$$

$$1.215x-0.215<y \tag{63}$$

$$z<x \tag{64}$$

$$1.215x-0.215<u \tag{65}$$

$$v<x \tag{66}$$

As can be seen from the mathematical formula (3) and FIG. 12, the following mathematical formulae (67) to (70) hold when the mathematical formulae (62) to (66) are satisfied. This causes a compressive strain to be generated in the channel layer, a tensile strain to be generated in the barrier layer, and a compressive strain to be generated in the spacer layer. Thus, the effects of increasing the $V_{th}$ and reducing the on-state resistance can be obtained as in the first embodiment.

$$a(x,1-x)<a(y,0) \tag{67}$$

$$a(z,1-z)<a(x,1-x) \tag{68}$$

$$a(x,1-x)<a(u,0) \tag{69}$$

$$a(v,1-v)<a(x,1-x) \tag{70}$$

[Thirteenth Embodiment]

Figure 21:
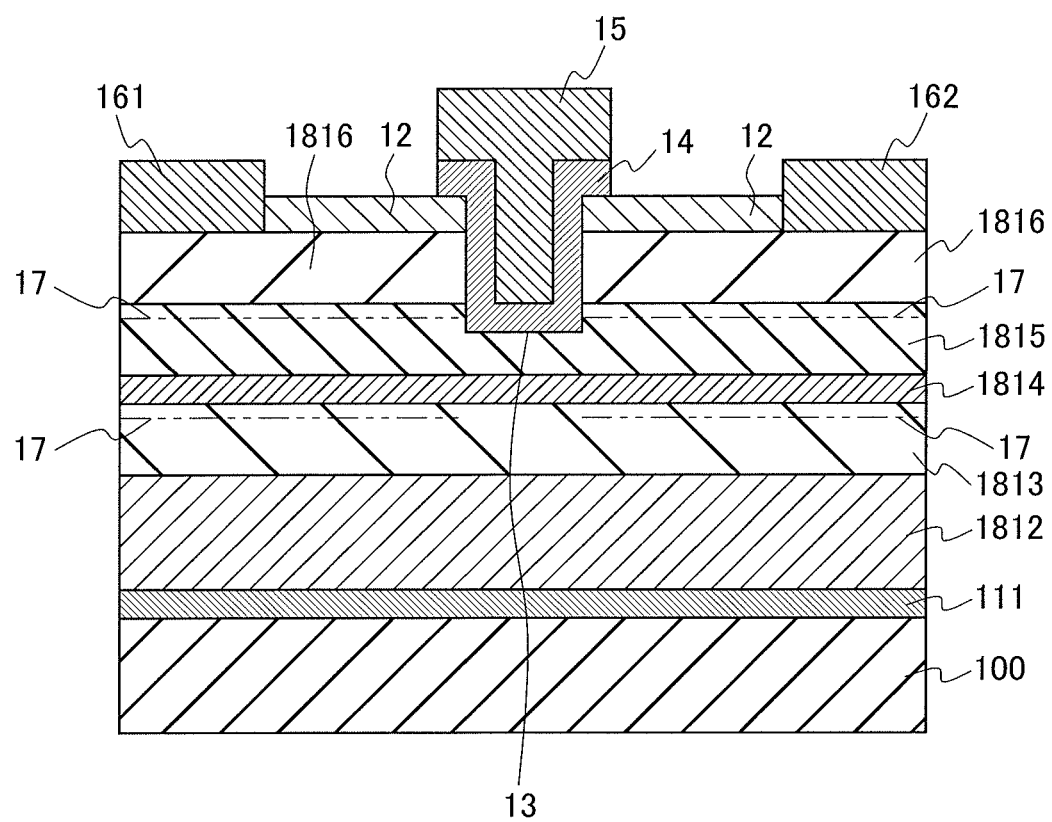
FIG. 21 is a cross-sectional view showing the structure of a FET according to the thirteenth embodiment of the present invention.

The cross-sectional view of FIG. 21 schematically shows the cross-sectional structure of a FET according to the thirteenth embodiment of the present invention. In FIG. 21, the numeral 1812 indicates a buffer layer, the numeral 1813 indicates a channel layer, the numeral 1814 indicates a barrier layer, the numeral 1815 indicates a spacer layer, and the numeral 1816 indicates an electron supply layer. The other numerals indicate the same as those indicated by the same numerals in FIG. 1B. As shown in FIG. 21, this FET has the same structure as the FET of FIG. 1B except that it has a laminate structure obtained by laminating a buffer layer 1812, a channel layer 1813, a barrier layer 1814, a spacer layer 1815, and an electron supply layer 1816 in this order as substitute for the laminate structure including a buffer layer 112, a channel layer 113, a barrier layer 114, a spacer layer 115, and an electron supply layer 116. The composition of each of the buffer layer 1812, the channel layer 1813, the barrier layer 1814, the spacer layer 1815, and the electron supply layer 1816 is as follows.

1812: $In_xGa_{1-x}N$ buffer layer (a axis length: a (x, 0))
1813: $In_yGa_{1-y}N$ channel layer (a axis length: a (y, 0))
1814: $In_zAl_{1-z}N$ barrier layer (a axis length: a (z, 1−z))
1815: $In_uGa_{1-u}N$ spacer layer (a axis length: a (u, 0))
1816: $In_vAl_{1-v}N$ electron supply layer (a axis length: a (v, 1−v))

It is to be noted that the composition ratios are set so that the buffer layer 1812, the channel layer 1813, the barrier layer 1814, the spacer layer 1815, and the electron supply layer 1816 satisfy the following mathematical formulae (71) to (75) (e.g., x=0.0, y=u=0.05, z=0.08, v=0.13).

$$0 \leq x<1 \tag{71}$$

$$x<y \tag{72}$$

$$1.215z-0.215<x \tag{73}$$

$$x<u \tag{74}$$

$$1.215v-0.215<x \tag{75}$$

As can be seen from the mathematical formula (3) and FIG. 12, the following mathematical formulae (76) to (79) hold when the mathematical formulae (71) to (75) are satisfied. This causes a compressive strain to be generated in the channel layer, a tensile strain to be generated in the barrier layer, and a compressive strain to be generated in the spacer layer. Thus, the effects of increasing the $V_{th}$ and reducing the on-state resistance can be obtained as in the first embodiment.

$$a(x,0)<a(y,0) \tag{76}$$

$$a(z,1-z)<a(x,0) \tag{77}$$

$$a(x,0)<a(u,0) \tag{78}$$

$$a(v,1-v)<a(x,0) \tag{79}$$

[Fourteenth Embodiment]

Figure 22:
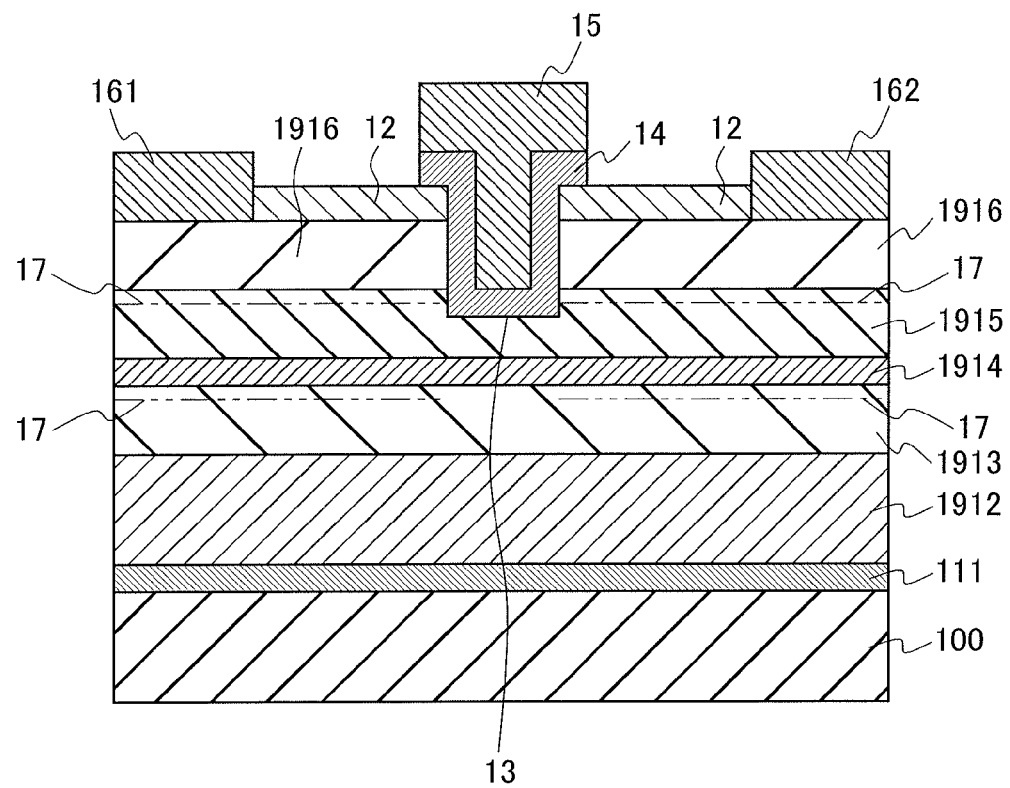
FIG. 22 is a cross-sectional view showing the structure of a FET according to the fourteenth embodiment of the present invention.

The cross-sectional view of FIG. 22 schematically shows the cross-sectional structure of a FET according to the fourteenth embodiment of the present invention. In FIG. 22, the numeral 1912 indicates a buffer layer, the numeral 1913 indicates a channel layer, the numeral 1914 indicates a barrier layer, the numeral 1915 indicates a spacer layer, and the numeral 1916 indicates an electron supply layer. The other numerals indicate the same as those indicated by the same numerals in FIG. 1B. As shown in FIG. 22, this FET has the same structure as the FET of FIG. 1B except that it has a laminate structure obtained by laminating a buffer layer 1912, a channel layer 1913, a barrier layer 1914, a spacer layer 1915, and an electron supply layer 1916 in this order as substitute for the laminate structure including a buffer layer 112, a channel layer 113, a barrier layer 114, a spacer layer 115, and an electron supply layer 116. The composition of each of the buffer layer 1912, the channel layer 1913, the barrier layer 1914, the spacer layer 1915, and the electron supply layer 1916 is as follows.

1912: $In_xGa_{1-x}N$ buffer layer (a axis length: a (x, 0))
1913: $In_yGa_{1-y}N$ channel layer (a axis length: a (y, 0))
1914: $In_zGa_{1-z}N$ barrier layer (a axis length: a (z, 0))
1915: $In_uGa_{1-u}N$ spacer layer (a axis length: a (u, 0))
1916: $In_vGa_{1-v}N$ electron supply layer (a axis length: a (v, 0))

It is to be noted that the composition ratios are set so that the buffer layer 1912, the channel layer 1913, the barrier layer 1914, the spacer layer 1915, and the electron supply layer 1916 satisfy the following mathematical formulae (80) to (84) (e.g., x=0.1, y=u=0.15, z=0.0, v=0.05).

$$0<x<1 \tag{80}$$

$$x<y \tag{81}$$

$$z<x \tag{82}$$

$$x<u \tag{83}$$

$$v<x \tag{84}$$

As can be seen from the mathematical formula (3) and FIG. 12, the following mathematical formulae (85) to (88) hold when the mathematical formulae (80) to (84) are satisfied. This causes a compressive strain to be generated in the channel layer, a tensile strain to be generated in the barrier layer, and a compressive strain to be generated in the spacer layer. Thus, the effects of increasing the $V_{th}$ and reducing the on-state resistance can be obtained as in the first embodiment.

$$a(x,0)<a(y,0) \tag{85}$$

$$a(z,0)<a(x,0) \tag{86}$$

$$a(x,0)<a(u,0) \tag{87}$$

$$a(v,0)<a(x,0) \tag{88}$$

The fifth to fourteenth embodiments show examples each having the same layer structure as in FIG. 1B (the first embodiment) with the different composition of layers. The embodiments may be examples each having the same layer structure as in any of FIG. 1A (the first embodiment) and FIGS. 9 to 11 (the second to fourth embodiments) with the different composition of layers, for example. In the fifth to fourteenth embodiments, the thickness of each of the layers may be, for example, the same as that in the first to fifth embodiments.

The present invention is described above with reference to the embodiments. The present invention, however, is not limited to these descriptions, and various changes can be made.

In each of the embodiments, Si is used as a substrate, for example. The substrate may be any of other substrates such as silicon carbide (SiC), sapphire ($Al_2O_3$), GaN, and diamond (C).

In each of the embodiments, a superlattice of AlN and GaN is used as a nucleation layer. A single layer such as AlN, AlGaN, or GaN may be used as the same.

In the first to fourth embodiments, AlGaN is used as a material for forming a buffer layer. In the second FET of the present invention, for example, any of other group-III nitride semiconductors such as GaN, gallium indium nitride (InGaN), aluminum indium nitride (InAlN), and InAlGaN may be used as the same as in the fifth to fourteenth embodiments.

In the first to fourth embodiments, GaN or AlGaN is used as each of materials for forming a channel layer and a spacer layer. In the second FET of the present invention, any of other group-III nitride semiconductors with a band gap less than a buffer layer may be used as the same. For example, any of other group-III nitride semiconductors such as InGaN, InAlN, InAlGaN, and InN may be used as each of the materials for forming a channel layer and a spacer layer as in the fifth to fourteenth embodiments. The material for forming a channel layer may be the same as or different from the material for forming a spacer layer.

In the first to fourth embodiments, AlGaN or AlN is used as each of materials for forming a barrier layer and an electron supply layer. In the second FET of the present invention, any of other group-III nitride semiconductors with a band gap greater than a buffer layer may be used as the same. For example, each of the materials for forming a barrier layer and an electron supply layer may be any of InGaN, InAlN, InAlGaN, and GaN as in the fifth to fourteenth embodiments. The material for forming a barrier layer may be identical to or different from the material for forming an electron supply layer.

In each of the embodiments, $Al_2O_3$ is used as a gate insulating film. Any of other insulators such as silicon dioxide ($SiO_2$) and $Si_3N_4$ may be used as the same.

In each of the embodiments, $Si_3N_4$ is used as a surface protective film (insulator). Any of the other insulators such as $Al_2O_3$ and $SiO_2$ may be used as the same.

In each of the embodiments, Ti/Al/Ni/Au is used as each of materials for forming a source electrode and a drain electrode.

Any of other materials such as Ti/Al, Ti/Al/molybdenum (Mo)/Au, and Ti/Al/niobium (Nb)/Au may be used as the same.

In each of the embodiments, Ni/Au is used as a material for forming a gate electrode. Any of other materials such as Ni/palladium (Pd)/Au, Ni/platinum (Pt)/Au, Ti/Au, Ti/Pd/Au, and Ti/Pt/Au may be used as the same.

As described above, according to the present invention, a field effect transistor which can achieve both of a high $V_{th}$ and a low on-state resistance can be obtained. The field effect transistor of the present invention can increase the off-state breakdown voltage and reduce the on-state resistant. Thus, the field effect transistor of the present invention can be used as, for example, a power semiconductor element which contributes largely to the reduction in loss (energy conservation) in an electronic device (electronic equipment) such as a switching power supply or an inverter circuit. As mentioned above, the electronic device of the present invention includes the semiconductor device of the present invention. The use of the electronic device of the present invention is not particularly limited, and it can be used widely in motor controllers (e.g., for an electric car, an air conditioner, and the like), power supply devices (e.g., for a computer and the like), inverter lighting, high-frequency power generators (e.g., for a microwave oven, an electromagnetic cooker, and the like), image displays, information recording/reproducing devices, and communication devices, for example. The field effect transistor of the present invention can contribute largely to the saving of power of the electronic devices (electronic equipment).

The invention of the present application is described above with reference to the embodiments. However, various changes that can be understood by those skilled in the art can be made in the configurations and details of the invention within the scope of the invention of the present application.

This application claims priority from Japanese Patent Application No. 2010-073879 filed on Mar. 26, 2010. The entire subject matter of the Japanese Patent Applications is incorporated herein by reference.

EXPLANATION OF REFERENCE NUMERALS

| | |
|---|---|
| 100, 900 | substrate |
| 111, 911 | nucleation layer |
| 112 | buffer layer |
| 113, 413, 913 | channel layer |
| 114 | barrier layer |
| 115 | spacer layer |
| 116, 916 | electron supply layer |
| 12 | surface protective film |
| 13, 93 | recess portion (opening portion to be filled) |
| 14, 94 | gate insulating film |
| 15, 95 | gate electrode |
| 161, 961 | source electrode |
| 162, 962 | drain electrode |
| 17, 97 | 2DEG |
| 28, 98 | n-type impurity addition region |
| 33 | ohmic recess portion |
| 1012, 1112, 1212, 1312, 1412, 1512, 1612, 1712, 1812, 1912 | buffer layer |
| 1013, 1113, 1213, 1313, 1413, 1513, 1613, 1713, 1813, 1913 | channel layer |
| 1014, 1114, 1214, 1314, 1414, 1514, 1614, 1714, 1814, 1914 | barrier layer |
| 1015, 1115, 1215, 1315, 1415, 1515, 1615, 1715, 1815, 1915 | spacer layer |
| 1016, 1116, 1216, 1316, 1416, 1516, 1616, 1716, 1816, 1916 | electron supply layer |

The invention claimed is:

1. A field effect transistor comprising:
a substrate;
a buffer layer;
a channel layer;
a barrier layer;
a spacer layer;
a gate insulating film;
a gate electrode;
a source electrode; and
a drain electrode, wherein
the buffer layer is formed of lattice-relaxed $Al_xGa_{1-x}N$ (0<x<1),
the channel layer is formed of $Al_yGa_{1-y}N$ (0<y<x) with an Al composition ratio less than the buffer layer,
the barrier layer is formed of $Al_zGa_{1-z}N$ (x<z≤1) with an Al composition ratio greater than the buffer layer,
the spacer layer is formed of $Al_uGa_{1-u}N$ (0≤u<x) with an Al composition ratio less than the buffer layer,
each of the upper surfaces of the buffer layer, the channel layer, the barrier layer, and the spacer layer is a Ga plane or an Al plane that is perpendicular to a (0001) crystal axis,
the buffer layer, the channel layer, the barrier layer, and the space layer are laminated on the substrate in this order,
the gate insulating film is arranged on the spacer layer,
the gate electrode is arranged on the gate insulating film, and
the source electrode and the drain electrode are electrically connected to the channel layer directly or via another component.

2. The field effect transistor according to claim 1, wherein the Al composition ratio x of the buffer layer is 0.05 or more to 0.2 or less.

3. The field effect transistor according to claim 1, wherein the Al composition ratio z of the barrier layer is 0.4 or more to 1 or less.

4. The field effect transistor according to claim 1, wherein the Al composition ratio y of the channel layer is 0.1 or less.

5. The field effect transistor according to claim 1, wherein the Al composition ratio u of the spacer layer is 0.1 or less.

6. A field effect transistor comprising:
a substrate;
a buffer layer;
a channel layer;
a barrier layer;
a spacer layer;
a gate electrode;
a gate insulating film;
a source electrode; and
a drain electrode, wherein
each of the buffer layer, the channel layer, the barrier layer, and the spacer layer is formed of a group-III nitride semiconductor,
each of the upper surfaces of the buffer layer, the channel layer, the barrier layer, and the spacer layer is a group-III atomic plane that is perpendicular to a (0001) crystal axis,
the buffer layer is lattice-relaxed,
the channel layer has a compressive strain,
the barrier layer has a tensile strain, the spacer layer has a compressive strain, the buffer layer, the channel layer, the barrier layer, and the spacer layer are laminated on the substrate in this order, the gate insulating film is arranged on the spacer layer, the gate electrode is arranged on the gate insulating film, and the source electrode and the drain electrode are electrically connected to the channel layer directly or via another component.

7. The field effect transistor according to claim 6, wherein the buffer layer is formed of GaN, AlGaN, InGaN, InAlN, or InAlGaN.

8. The field effect transistor according to claim 6, wherein the channel layer is formed of InGaN, InAlN, InAlGaN, or InN, and a material for forming a channel layer has a band gap less than a material for forming a buffer layer.

9. The field effect transistor according to claim 6, wherein the barrier layer is formed of AlGaN, AlN, InGaN, InAlN, InAlGaN, or GaN, and a material for forming a barrier layer has a band gap greater than a material for forming a buffer layer.

10. The field effect transistor according to claim 6, wherein the spacer layer is formed of InGaN, InAlN, InAlGaN, or InN, and a material for forming a spacer layer has a band gap less than a material for forming a buffer layer.

11. The field effect transistor according to claim 1, wherein the barrier layer has a thickness of 1 nm or more to 10 nm or less.

12. The field effect transistor according to claim 1, wherein the spacer layer under the gate electrode has a thickness of 0.5 nm or more to 20nm or less.

13. The field effect transistor according to claim 1, wherein at least one of the semiconductor layers formed below the gate electrode contains a p-type impurity.

14. The field effect transistor according to claim 1, further comprising:

an electron supply layer, wherein the electron supply layer is arranged on the spacer layer, an opening portion to be filled is formed from the upper surface of the electron supply layer to the upper surface of the spacer layer in a part of the electron supply layer, the gate electrode and the gate insulating film are arranged so as to fill the opening portion to be filled, the gate insulating film is in contact with the upper surface of the spacer layer, and the source electrode and the drain electrode are in contact with the electron supply layer and are arranged so as to face each other across the gate electrode.

15. The field effect transistor according to claim 14, wherein the opening portion to be filled formed in a part of the electron supply layer is formed by removing a part of the electron supply layer.

16. The field effect transistor according to claim 14, wherein the electron supply layer is formed of AlGaN, AlN, InGaN, InAlN, InAlGaN, or GaN, and a material for forming an electron supply layer has a band gap greater than a material for forming a buffer layer.

17. The field effect transistor according to claim 14, wherein the buffer layer is formed of lattice-relaxed $Al_xGa_{1-x}N$ ($0<x<1$), and the electron supply layer is formed of $Al_vGa_{1-v}N$ ($x<v\leq 1$) with an Al composition ratio greater than the buffer layer.

18. The field effect transistor according to claim 1, wherein an n-type impurity containing region is formed in at least a part under the source electrode or the drain electrode; and the n-type impurity containing region includes at least a part of the barrier layer.

19. The field effect transistor according to claim 1, wherein an opening portion to be filled or a notch portion is formed from the upper surface of the spacer layer to the upper surface of the barrier layer in at least a part of the spacer layer below the source electrode and the drain electrode, and the source electrode and the drain electrode are in contact with the upper surface of the barrier layer and are arranged so as to face each other across the gate electrode.

20. The field effect transistor according to claim 19, wherein the opening portion to be filled or the notch portion formed in at least a part of the spacer layer is formed by removing a part of the spacer layer.

21. The field effect transistor according to claim 19, wherein an n-type impurity containing region is formed in at least a part under the source electrode or the drain electrode, and the n-type impurity containing region includes at least a part of the barrier layer.

22. An electronic device comprising the field effect transistor according to claim 1.

* * * * *

UNITED STATES PATENT AND TRADEMARK OFFICE
CERTIFICATE OF CORRECTION

PATENT NO. : 8,921,894 B2  
APPLICATION NO. : 13/637555  
DATED : December 30, 2014  
INVENTOR(S) : Yuji Ando et al.

Page 1 of 1

It is certified that error appears in the above-identified patent and that said Letters Patent is hereby corrected as shown below:

In the Drawings

Drawing Sheet 6 of 20: Delete "AIN" and insert -- AlN --

In the Specification

Column 15, Line 44: Delete "$cm^3$" and insert -- $cm^{-3}$ --

Column 16, Line 59: Delete "EFT" and insert -- FET --

Column 19, Line 61: Delete "$InxAlyGa_{1-x-y}N$" and insert -- $In_xAl_yGa_{1-x-y}N$ --

In the Claims

Column 30, Line 20: In Claim 1, delete "$Al_yGa_{1-y}N$ (0<y <x)" and insert -- $Al_yGa_{1-y}N$ (0≤y<x) --

Column 30, Line 22: In Claim 1, delete "$Al_yGa_{1-y}N$" and insert -- $Al_zGa_{1-z}N$ --

Column 31, Line 14: In Claim 8, delete "InAlGaN," and insert -- InAlGaN, --

Column 31, Line 33: In Claim 12, delete "20nm" and insert -- 20 nm --

Signed and Sealed this  
Twenty-fifth Day of August, 2015

Michelle K. Lee  
*Director of the United States Patent and Trademark Office*